(12) United States Patent
Uno et al.

(10) Patent No.: US 8,102,061 B2
(45) Date of Patent: Jan. 24, 2012

(54) SEMICONDUCTOR DEVICE BONDING WIRE AND WIRE BONDING METHOD

(75) Inventors: Tomohiro Uno, Tokyo (JP); Keiichi Kimura, Tokyo (JP); Shinichi Terashima, Tokyo (JP); Takashi Yamada, Iruma (JP); Akihito Nishibayashi, Iruma (JP)

(73) Assignees: Nippon Steel Materials Co., Ltd., Tokyo (JP); Nippon Micrometal Corporation, Iruma (JP)

( * ) Notice: Subject to any disclaimer, the term of this patent is extended or adjusted under 35 U.S.C. 154(b) by 0 days.

(21) Appl. No.: 12/670,253

(22) PCT Filed: Jul. 24, 2008

(86) PCT No.: PCT/JP2008/063256
§ 371 (c)(1),
(2), (4) Date: Jul. 27, 2010

(87) PCT Pub. No.: WO2009/014168
PCT Pub. Date: Jan. 29, 2009

(65) Prior Publication Data
US 2010/0327450 A1 Dec. 30, 2010

(30) Foreign Application Priority Data
Jul. 24, 2007 (JP) ................................ 2007-192193

(51) Int. Cl.
*H01L 29/40* (2006.01)
*H01L 21/44* (2006.01)
(52) U.S. Cl. ........................................ 257/784; 438/617
(58) Field of Classification Search .................. 257/784; 438/617
See application file for complete search history.

(56) References Cited

U.S. PATENT DOCUMENTS

| | | | | |
|---|---|---|---|---|
| 2004/0014266 A1* | 1/2004 | Uno et al. | ...................... | 438/200 |
| 2004/0245320 A1 | 12/2004 | Fukagaya et al. | | |
| 2009/0188696 A1* | 7/2009 | Uno et al. | .................. | 174/126.2 |

FOREIGN PATENT DOCUMENTS

| JP | 61099645 A | 5/1986 |
|---|---|---|
| JP | 62097360 A | 5/1987 |
| JP | 63024660 A | 2/1988 |
| JP | 2004064033 A | 2/2004 |
| JP | 2006-100777 A | 4/2006 |
| JP | 2006216929 A | 8/2006 |
| JP | 2007012776 A | 1/2007 |

OTHER PUBLICATIONS

P. Devlin, Lee Levine et al., "Copper Ball Bonding for Fina Pitch, High I/O Devices": 38th International Symposium on Microelectionics (2005) pp. 320-324.
Basic and Industrial Technology of Copper and Copper Alloy (revised edition), May 25, 1988.

* cited by examiner

*Primary Examiner* — James Mitchell
(74) *Attorney, Agent, or Firm* — McDermott Will & Emery LLP

(57) ABSTRACT

It is an object of the present invention to provide a copper-based bonding wire whose material cost is low, having excellent ball bondability, reliability in a heat cycle test or reflow test, and storage life, enabling an application to thinning of a wire used for fine pitch connection. The bonding wire includes a core material having copper as a main component and an outer layer which is provided on the core material and contains a metal M and copper, in which the metal M differs from the core material in one or both of components and composition. The outer layer is 0.021 to 0.12 μm in thickness.

10 Claims, 1 Drawing Sheet

SEMICONDUCTOR DEVICE BONDING WIRE AND WIRE BONDING METHOD

CROSS-REFERENCE TO PRIOR APPLICATION

This is the U.S. National Phase Application under 35 U.S.C. §371 of International Patent Application No. PCT/JP2008/063256, filed Jul. 24, 2008, which claims the benefit of Japanese Patent Application No. 2007-192193, filed Jul. 24, 2007, both of which are hereby incorporated by reference in their entireties herein. The International Application was published in Japanese on Jan. 29, 2009 as WO2009/014168 A1 under PCT Article 21(2).

TECHNICAL FIELD

The present invention relates to a semiconductor device bonding wire utilized to connect an electrode on a semiconductor device and a wiring of a circuit wiring board (lead frame, substrate, tape or the like), and also relates to a wire bonding method.

BACKGROUND ART

Currently, thin wires (bonding wires) having a wire diameter of 20 to 50 μm or so are popularly used as bonding wires for connecting an electrode on a semiconductor element and an external terminal together. A thermal compressive bonding technique with the aid of ultrasound is generally applied to bond bonding wires, and a general-purpose bonding device, and a capillary jig which allows a bonding wire to pass through the interior thereof for connection are used. A leading end of a bonding wire is heated and melted by arc heat inputting, a ball is formed by surface tension, and then the ball is compressively bonded on an electrode of a semiconductor element heated within a range from 150 to 300° C. beforehand. Thereafter, the bonding wire is directly bonded to an external lead by ultrasound compressive bonding.

Recently, techniques related to the structure, material and connection for the semiconductor packaging technologies are rapidly diversified, and for example, in a packaging structure technology, in addition to currently-used QFP (Quad Flat Packaging) using a lead frame, new configurations, such as BGA (Ball Grid Array) using a substrate, a polyimide tape or the like and CSP (Chip Scale Packaging) are practically used, and a bonding wire which has improved loop characteristic, bonding property, mass productivity, usability and the like becomes requisite. Among those improved bonding wire connecting techniques, the wedge-to-wedge bonding technique suitable for fine pitch connection, other than the currently mainstream ball/wedge bonding techniques, requires the fine wire bondability to be improved as the wire is directly bonded at two locations.

Materials to be bonded with the bonding wire have also become diversified. In addition to the conventional Al alloy, copper suitable for a finer wiring has been practically used as a wiring and electrode material on silicon substrates. Ag-plating and Pd-plating are applied onto an upper portion of a lead frame, while copper wirings are applied onto upper portions of a resin substrate, a tape or the like, onto which a film of a noble-metal element such as gold or its alloy is often applied. Depending on a variety of these bonding target materials, a bonding wire is required to be improved in bondability and reliability.

So far, 4N-group gold having a high purity (purity >99.99 mass %) has been mainly used as a material of a bonding wire. Gold is, however, expensive and hence a bonding wire made of another metal material which is less expensive has been desired.

According to the requirements of the wire bonding techniques, it is important to form a ball with a good sphericity at the time of forming the ball and to obtain a sufficient bonding strength in a bonded portion between the ball and an electrode. Further, to cope with lowering of a bonding temperature, thinning of a bonding wire, etc., a bonding strength, a tensile strength and the like are requisite at a part where a bonding wire is subjected to wedge bonding to a wiring on a circuit wiring board.

In the resin encapsulation process of injecting high-viscosity thermosetting epoxy resin at high speeds, there occurs a problem that a bonding wire is deformed to come in contact with the adjacent wires, and besides the wire deformation is required to be restrained as much as possible, in a resin encapsulation process under the situations where pitches become finer, wires become longer and thinner. Although such deformation can be controlled to some extent by an increase in wire strength, this resin encapsulation process still involves difficulties in putting it for practical application, unless some problems that loop control becomes difficult and the strength in bonding decreases, etc. are solved.

Besides, long-term reliability is also important at the time of actual use of a semiconductor element on which a bonding wire is connected and mounted. Particularly for a semiconductor element or the like mounted on an automobile, high reliability under such severe environments as a high temperature, high humidity, heat cycle or the like is required in order to ensure strict safety. Even in such unprecedented severe environments, high reliability must be maintained without deteriorating a bonded portion where the bonding wire has been connected.

As wire characteristics for satisfying the above requirements, it is desired that overall characteristic features thereof be satisfied, such as easy loop control in a bonding process, improved bondability to an electrode and a lead wire, restrained excessive wire deformation in a resin encapsulation process subsequent to the bonding process, and furthermore, long-term reliability in a connected portion as well as stability at a bonded portion under severe environments.

A bonding wire made of copper has been developed in order to achieve low material cost, excellent electric conductivity, enhanced ball bonding and wedge bonding properties, as is disclosed in patent literature 1, etc. According to the copper bonding wire, however, there occur problems that the oxidization of the wire surface reduces bonding strength and the wire surface is prone to generate corrosion or the like at the time of resin encapsulation. These problems are partially responsible for the lack of progress in practical application of the copper bonding wire.

In the copper-based bonding wire, when forming a ball by melting a wire tip, the bonding process is performed with a gas sprayed onto the wire tip in order to inhibit oxidation. Currently, a nitrogen gas containing 5 vol % hydrogen is generally employed as an atmospheric gas used in forming a ball of the copper-based bonding wire. In patent literature 2, it is disclosed that when a copper wire is bonded to a copper lead frame or a copper alloy lead frame, the bonding process is performed in the atmosphere containing 5 vol % $H_2+N_2$. Also, in non-patent literature 1 is reported that in forming a ball of the copper bonding wire, the 5 vol % $H_2+N_2$ gas can prevent a ball surface from being oxidized and therefore, the 5 vol % $H_2+N_2$ gas is more desirable than a $N_2$ gas. Today, the 5 vol % $H_2+N_2$ gas has been standardized as a gas used in employing the copper-based bonding wire.

As a technique of suppressing any oxidization of a surface of a copper bonding wire, patent literature 3 discloses a bonding wire in which copper is covered with a noble metal or a corrosion-resistant metal, such as gold, silver, platinum, palladium, nickel, cobalt, chrome, titanium, and the like. Moreover, from the standpoint of a ball formability and suppression of deterioration of a plating solution, patent literature 4 discloses a bonding wire so structured as to have a core member mainly composed of copper, a dissimilar metal layer formed on the core member and made of a metal other than copper, and a coating layer formed on the dissimilar metal layer and made of an oxidization-resistant metal having a higher melting point than copper. Patent literature 5 discloses a bonding wire comprising a core member mainly composed of copper, and an outer skin layer which contains a metal, having either one of or both of a constituent and a texture different from the core member, and copper, and which is a thin film having a thickness of 0.001 to 0.02 µm.

Patent literature 1: Japanese unexamined patent application publication No. S16-99645
Patent literature 2: Japanese unexamined patent application publication No. S63-24660
Patent literature 3: Japanese unexamined patent application publication No. S62-97360
Patent literature 4: Japanese unexamined patent application publication No. 2004-64033
Patent literature 5: Japanese unexamined patent application publication No. 2007-12776
Non-patent literature: "Copper Ball Bonding for Fine Pitch, High I/O Devices": P. Devlin, Lee Levine, 38th International Symposium on Microelectronics (2005), P.320-324.

DISCLOSURE OF THE INVENTION

Problem to be Solved by the Invention

The conventional copper bonding wire with a monolayer structure (i.e., a non-coated copper bonding wire which, in some cases, is formed with a thin and naturally oxidized film layer on its wire surface. Hereinafter called a monolayer copper wire), has practical problems that the wire surface is easily oxidized, decrease in bonding strength is prone to occur, etc. Thus, as a means for preventing the oxidation of the surface of the copper bonding wire, the wire surface may be coated with a noble metal or oxidation-resistance metal.

Study by the present inventors in view of the needs for density growth, miniaturization, thinning or the like in the semiconductor packaging technology has revealed that the conventional multilayer copper wires with its surface coated with a metal different from copper (herein, a non-coated copper wire is called a monolayer copper wire, while a copper wire coated with one layer is called a multilayer wire, and thus, hereinafter called a conventional multilayer copper wire), have lots of hereinbelow-mentioned practical problems that remain unsolved.

When a ball is formed on a tip of the conventional multilayer copper wire, a flat ball formed with a decreased degree of sphericity, an unmelted part of the wire remaining inside the ball, and the generation of bubbles become problems. If such irregular balls are bonded on electrodes, reduction in bonding strength, chip damage or the like are caused.

When performing a complicated loop control using the conventional multilayer copper wire, a coated layer and the copper may peel from each other between their interface, and therefore, there occur concerns that a loop shape may become unstable, and adjacent wires may become electrically short-circuited in the case of fine-pitch bonding.

When forming a ball using the conventional multilayer copper wire, it is of a practical concern that a defective shape of a ball bonded portion and a reduction in bonding strength are mole likely to take place than when using a monolayer copper wire or a currently mainly used gold bonding wire. To give specific failure examples, formation of a flat ball with a decreased degree of sphericity, misalignment of a ball formed obliquely relative to a wire, part of the wire remaining inside the ball, and the formation of bubbles (blow holes) sometimes become problems. If such irregular balls are bonded onto an electrode, there will occur a misalignment deformation where the ball is misaligned with the center of the wire and deformed, an elliptical deformation where the ball is deviated from sphericity, and a petal-like deformation, etc., thus leading to protrusion of the bonded portion from an electrode surface, reduction in bonding strength, chip damage, failure in production management or the like. These initial bonding failures may cause the degradation of long-term reliability, as described above.

Patent literature 4 discloses that an outer skin layer may be formed to 0.001 to 0.02 µm thickness, as a technique for solving failures associated with the ball bonding of the conventional multilayer copper wire. The outer skin layer referred to here includes a concentration gradient region as well, and an interface between the outer skin layer and a core material, is described as having a metal M concentration of 10 mol % or more. Through the study by the inventors of the present invention, it has been observed that the above-mentioned problems concerning the ball bonded portion are partially improved by thinning the outer skin layer, yet it has been verified that such improvement does not necessarily suffice when used under new environments such as an application to a semiconductor or the like mounted on an automobile, but in fact, the thinner the outer skin layer, the more frequently a flat ball rather occurs. Besides, it has been verified that thinning a layer makes an improvement in wedge bonding insufficient, causing a hereinafter-described problem concerning long-term reliability.

For the sake of the evaluation under new severe environments, specifically, the following test is being performed. That is, in the reliability test of a semiconductor connected with a monolayer copper wire, a temperature cycle test (TCT test) is performed, showing a wire is fractured in the vicinity of a wedge-bonded portion, and the occurrence frequency of such wire fracture is higher than that in a gold bonding wire, which is now becoming a problem. In a solder reflow process as well, there is the concern about the failures that a bonded portion of a copper-based wire is similarly fractured. This is also a type of wire fracture caused by thermal fatigue. A Pb free solder that has been rapidly put into a practical use for the sake of the environmental countermeasure is higher in a melting point than the conventional tin-lead solder, and therefore, thermal strain due to the use of Pb free solder is becoming a problem. The wire fracture is attributable to a failure caused by differences in thermal expansion among constituent members of a semiconductor such as encapsulating resin, a lead frame, a silicon chip or the like. In order to cope with an increased calorific value at the time of an operation of a semiconductor, an increase in temperature of the usage environment and increased variations in temperature of the same, it becomes important to reduce wire fracture in the TCT test in the case of the copper-based bonding wire.

The present inventors have verified that the frequency of failure occurrence under the TCT test becomes slightly decreases in the conventional multilayer copper wire as compared to in a monolayer copper wire, but it is still inferior to a gold bonding wire. For example, if the outer skin layer described above is as thin as 0.001 to 0.02 μm in the conventional multilayer copper wire, the improvement effect exhibited in the TCT test was insufficient.

As surface oxidization proceeds in a monolayer copper wire, it becomes a problem in use that its storage life is short in the atmosphere. The conventional gold bonding wire can be stored for about one month before or during use. As for the monolayer copper wire, however, storing it only for several days in the atmosphere will cause a problem that the wedge bondability is reduced and a ball shape becomes unstable, which become factors causing deterioration in the workability of the copper-based bonding wire.

According to the conventional multilayer copper wire, the effect of retarding the oxidizing process can be more expected than done by the monolayer copper wire. This effect, however, significantly varies depending on the composition, structure and thickness of an outer layer of a wire or a vicinity of a wire surface. Therefore, it is important that the structure of the conventional multilayer copper wire be optimized. To ensure the equivalent workability to a gold bonding wire, wedge bondability and loop shape, etc. need to be ensured to be degradation-free, even after storage in the atmosphere for about two months. This means that several ten times the life duration must be ensured as compared to the storage life of the monolayer copper wire, leading to considerably strict conditions required for a material whose main constituent is copper.

Among the problems associated with oxidization, inhibition of oxidation at the time of forming a ball is also an important subject of a copper wire. For the conventional monolayer copper wire, a 5 vol % $H_2+N_2$ gas is popularly employed as a standard ball-forming gas. When the 5 vol % $H_2+N_2$ gas is employed, however, the cost for providing dedicated piping arises for the sake of providing the gas in a factory, and the running cost of this mixed gas is also expensive. When comparing total costs including the manufacturing cost, the cost advantage sometimes becomes smaller as compared to that of a gold bonding wire even if copper is used for a wire material. The gas cost is one of the factors for the copper-based bonding wire not to prevail. Further, safety management becomes strict due to as much as 5 vol % content of hydrogen, leading to a concern about a reduction in workability.

If a gas for forming a ball is comprised of $N_2$ only, a cost reducing effect is considerably enhanced and an obstacle to the safety management is reduced, and thus it has a number of advantages to a user. When using the conventional monolayer copper wire in mass production, however, a pure $N_2$ gas has not come into practical use because of the judgment that it is difficult to use in that case. Similarly, when using the conventional multilayer copper wire, totally stable productivity is easier to ensure by using the 5 vol % $H_2+N_2$ gas, and using the pure $N_2$ gas has led to some problems such as the occurrence of the above-mentioned misaligned ball, unstable ball size, etc. If there can be produced the conventional multilayer copper wire that is capable of providing high productivity and high reliability even when using the pure $N_2$ gas, the obstacle that hinders the spread of copper-based bonding wire is made small, and thus its practical application can be expected to be accelerated.

Therefore, it is an object of the present invention to provide a semiconductor device bonding wire mainly composed of copper, aimed at improving ball bondability, reducing the occurrence of failures in thermal cycle tests, and improving wire storage lifetime, in addition to the conventional fundamental performance, by solving the problems associated with the conventional techniques described above, and it is a further object to provide a method for wire bonding such bonding wire.

Mean for Solving the Problem

The present inventors have been dedicated to the study of the copper-based bonding wire in order to solve the problems described above, and as a result, it has been found out that it is effective for the copper-based bonding wire to have an outer layer and to provide the outer layer with a specific range of thickness, and that control of the compositions, structures or the like of the outer layer and the core material is even more effective.

The present invention has been made based on the above findings, and the structure thereof is summarized as below:

A bonding wire according to a first aspect of the present invention is a semiconductor device bonding wire including: a core material whose components include copper as a main component; an outer layer provided on said core material, said outer layer containing a metal M that differs from said core material in one or both of components and composition, and copper, wherein said outer layer is 0.021 to 0.12 μm in thickness.

The bonding wire according to a second aspect of the present invention is the one set forth in the first aspect in which the metal M constituting said outer layer includes at least one element selected from among Au, Pd, Pt and Rh as a main component.

The bonding wire according to a third aspect of the present invention is the one set forth in first or second aspect in which said core material including copper as a main component contains at least one element selected from among P, B, Ir, Zr, Bi, Ti, Au, Ag, Sn and rare-earth elements, and an elemental concentration of said at least one element relative to the whole wire is in a range of from 0.0001 to 0.03 mol % in total.

The bonding wire according to a fourth aspect of the present invention is the one set forth in any one of the first to third aspects, in which said outer layer contains at least one element selected from among Bi, P, Se and Tl, and an elemental concentration of said at least one element on a surface of said outer layer is in a range of from 0.01 to 5 mol % in total.

The bonding wire according to a fifth aspect of the present invention is the one set forth in any one of the first to fourth aspects, in which a diffusion layer is provided between said outer layer and said core material.

The bonding wire according to a sixth aspect of the present invention is the one set forth in any one of the first to fifth aspects, in which a carbon concentration in an outermost surface of said outer layer is in a range of from 15 to 80 mol %, and a region where the carbon concentration is in a range of from 5 to 80 mol % is 0.0004 to 0.01 μm in thickness in a depth direction from a surface of said outer layer, when compared in terms of concentration relative to a total of metallic elements, carbon, oxygen and nitrogen.

The bonding wire according to a seventh aspect of the present invention is the one set forth in any one of the first to sixth aspects, in which an oxygen concentration in an outermost surface of said outer layer is in a range of from 1 to 25 mol %, and a region where the oxygen concentration is in a range of from 0.2 to 25 mol % is 0.0005 to 0.007 μm in thickness in the surface of said outer layer, when compared in terms of concentration relative to a total of metallic elements, carbon, oxygen and nitrogen.

The bonding wire according to an eighth aspect of the present invention is the one set forth in any one of the first to seventh aspects, in which a region where a concentration of said metal M relative to a total of the metallic elements is 10 mol % or more is 0.03 to 0.2 μm in thickness.

The bonding wire according to a ninth aspect of the present invention is the one set forth in any one of the first to eighth aspects, in which a region inside said outer layer where a total concentration of said metal M relative to a total of the metallic elements is 90 mol % or more is 0.004 to 0.07 μm in thickness.

The bonding wire according to a tenth aspect of the present invention is the one set forth in any one of the first to ninth aspects, in which a region inside said outer layer where a total concentration of said metal M relative to a total of the metallic elements is 96 mol % or more is 0.002 to 0.06 μm in thickness.

The bonding wire according to an eleventh aspect of the present invention is the one set forth in any one of the first to tenth aspects, in which a copper concentration relative to a total of the metallic elements in the outermost layer of the outer layer is 45 mol % or less.

The bonding wire according to a twelfth aspect of the present invention is the one set forth in any one of the first to eleventh aspects, in which a region in the surface of said outer layer where a copper concentration relative to a total of the metallic elements is in a range of from 1 to 30 mol % is 0.0005 to 0.008 μm in thickness.

The bonding wire according to a thirteenth aspect of the present invention is the one set forth in any one of the first to twelfth aspects, in which a concentration of said metal M, which is contained in an entire wire and is other than copper, relative to a total of the metallic elements is in a range of from 0.05 to 3 mol %.

A wire bonding method according to a fourteenth aspect of the present invention is one for connecting the bonding wire set forth in any one of the first to thirteenth aspects, including the steps of forming a ball by generating an arc discharge while spraying a nitrogen gas of a 99.95 vol % or more purity to a wire tip or its surroundings; and then bonding the ball thus formed.

Effects of the Invention

According to the bonding wire of the present invention, it is possible to reduce the failures in a TCT test, to improve the ball bondability and the wire storage lifetime. As a result, there can be provided a copper-based bonding wire having advantages such as inexpensive material cost, excellent ball bondability and reliability in thermal cycle test or reflow test, longer storage life, good compatibility with wire thinning for fine pitch technique, and the like.

BRIEF DESCRIPTION OF THE DRAWINGS

The drawing figures depict one or more implementations in accord with the present teachings, by way of example only, not by way of limitation. In the figures, like reference numerals refer to the same or similar elements.

BEST MODE FOR CARRYING OUT THE INVENTION

Figure 1:
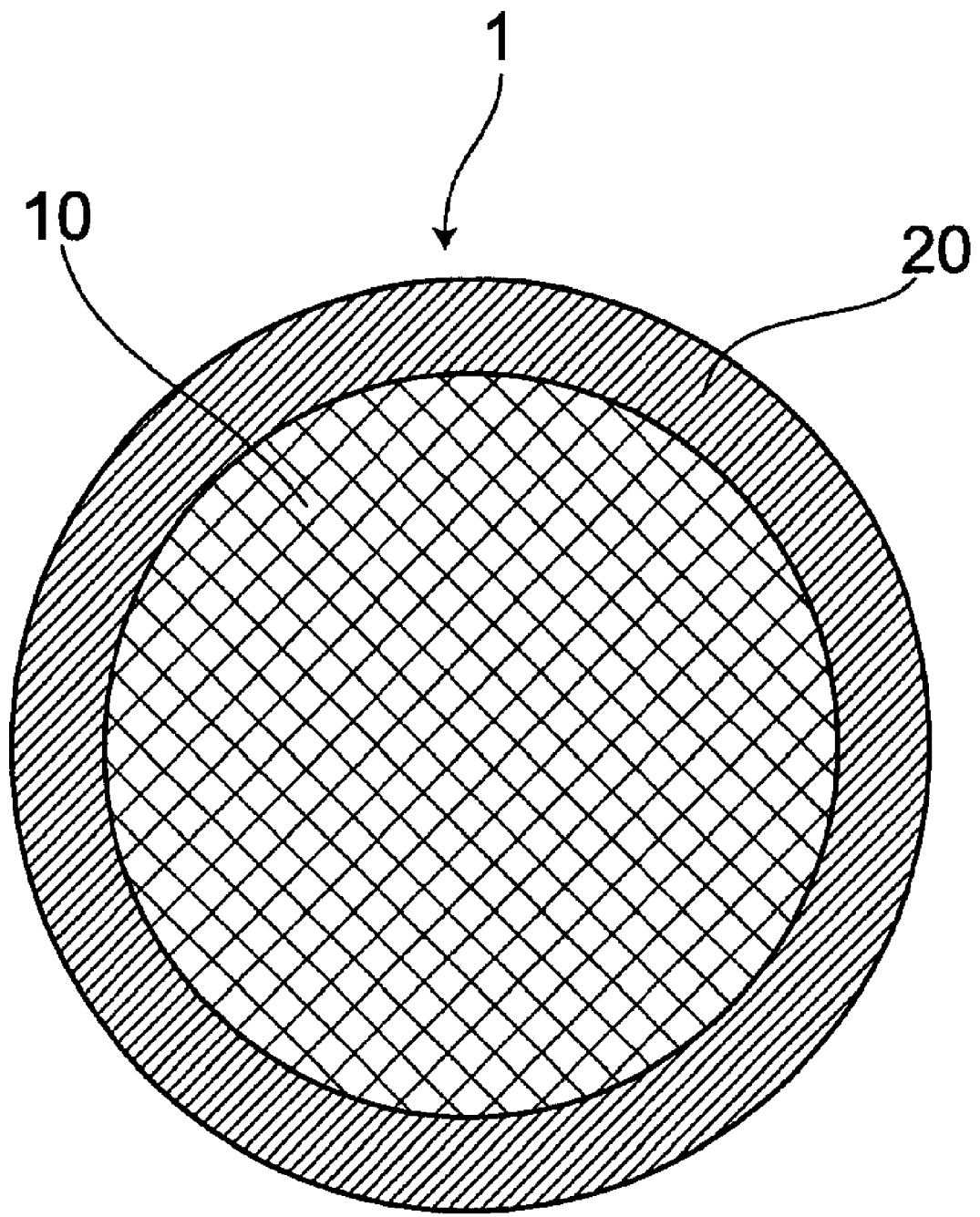
FIG. 1 is a cross-section view of the bonding wire of the present invention.

The study of a bonding wire 1, as illustrated in FIG. 1, includes a core material 10 whose main component is copper and an outer coated layer 20 containing a metal M, has revealed that whilst the improvement of wedge bondability can be expected by containing the metal M in the vicinity of a surface of the wire, unstable formation of balls and the occurrence of fractures in a wedge-bonded portion in thermal cycle test or reflow test have become new issues, and further the improvement effect of the storage life remains insufficient. Accordingly, as a result of having studied a copper-based bonding wire, which can meet the new needs from packaging techniques such as a small ball bonding at a fine pitch, high reliability of the wedge-bonded portion in thermal fatigue, prolonged storage life and the like, and which can also meet the needs for further improvement in mass production suitability and the improvement in bonding stability when using an inexpensive gas for reducing packaging process cost, it has been found out that it is effective for a bonding wire to have an outer layer with a specific thickness in a specific thickness range. Further, it has been found out that additional effects can be obtained by controlling the composition, structure, etc. of the outer layer, the core material, etc.

In other words, it is desirable that a bonding wire includes a core material whose components include copper as a main component and an outer layer provided on said core material, said outer layer containing a metal M that differs from said core material in one or both of components and composition, and copper, wherein said outer layer is 0.021 to 0.12 μm in thickness. By employing the bonding wire like this, a profound effect can be obtained that suppresses the wire fracture in a wedge-bonded portion in a thermal cycle test (TCT test) or a reflow test. In the meantime, the wording "main component" is used herein in the sense that the ratio of a copper concentration to a total concentration of copper and the metal M is 50% or more.

In the TCT test, rise and fall in temperature is repeated, so that thermal strain is generated that is attributable to heat expansion differences among encapsulating resin, a lead frame and a silicon chip, thereby inducing fracture and damage in the vicinity of the wedge-bonded portion that is originally weak in strength. In the wedge-bonded portion where the bonding wire is highly deformed, its wire strength generally becomes lower than a wire itself, due to reduction of a cross-sectional area and introduction of lattice defects at the time of processing. Additionally, it has turned out that peeling and fracture are prone to occur in the vicinity of the wedge-bonded portion, if tensile force and compressive force are repeatedly applied thereto, because a bonding strength of a copper wire at a wedge-bonded interface is considerably lower than that of a gold bonding wire. For these factors, occurrence of failures in a TCT test becomes a more major concern in a wedge-bonded portion of the copper-based bonding wire than in that of a gold bonding wire If the outer layer is 0.021 to 0.12 μm in thickness, it is considered that a factor for improvement of the reliability of the wedge-bonded portion in a TCT test is the effective action by the metal M constituting the outer layer to improve an adhesion property to a member to be bonded to. If the thickness thereof is 0.021 μm or more, the outer layer becomes substantially stabilized in a bonded interface to increase a strength and hence high reliability can be obtained in a TCT test. If the thickness thereof is less than 0.021 μm, it has been empirically figured out that sufficient reliability in a TCT test can not be obtained. This is considered to be attributable to the fact that the outer layer, together with the wire, is subjected to large deformation at the time of wedge bonding, and thus, there occur localized regions such that in one region the outer layer only remains thin at the bonded interface but in another region no outer layer exists, so that sufficient interface strength to withstand the TCT test can not be ensured. Even if the outer layer exists unevenly at the bonded interface, the uneven outer layer often works effectively to improve an initial bonding strength. In the thermal history of the TCT test, however, the strains in tensile and compressive directions get complexly involved in the wedge bonding, thereby making it impossible to ensure sufficient resistance properties. On the other hand, if the outer layer exceeds 0.12 μm in thickness, then the smoothness of a ball surface deteriorates, and defects of balls displaced from a center in a manner like golf-club occur, thus, leading to instabilities of a ball shape and size. If it is 0.12 μm or less, both of ball formability and wedge bondability, which has conventionally been considered to be difficult to achieve at the same time, can be satisfied.

Preferably, if the outer layer is in a range of from 0.025 to 0.095 μm in thickness, the defects in the TCT test under the strict thermal history conditions are decreased, permitting high reliability to be obtained. More preferably, if it is in a range of 0.03 to 0.085 μm, the reliability in the TCT test under the strict thermal history conditions can be more improved.

The damage of the wedge-bonded portion in the TCT test is also associated with a material of a lead frame. When a lead frame is made of a copper alloy, thermal strain is large and thus it is subject to the damage of the wedge-bonded portion, while when it is made of a 42 alloy with a small coefficient of thermal expansion, substantially no defects occur. Considering the increasing use of inexpensive copper-based lead frames in the future and the application of the copper-based bonding wire to in-vehicle semiconductors that require reliability to high temperature, the reliability of the copper-based bonding wire under the TCT test, though reported cases about it are still not so many, has recently become a highlighted issue.

Evaluative judgment only by the TCT test causes some concerns such as cumbersome preparation of samples, long evaluation time and varying evaluation results depending on the selection of members such as a lead frame and encapsulating resin, other than a bonding wire. Therefore, the present inventors have devised a tensile test for a wedge-bonded portion, (hereunder is referred to as a wedge bonding peel test) as a simple testing method for enhancing evaluation efficiency, verifying that the same correlation as that in the TCT test can be obtained. This is a measurement method in which an ordinary peel test that pulls up a wedge-bonded portion directly upward has been improved to make tensioning direction and velocity, etc., appropriate. It was verified that bonding wires and bonding samples that were tested as having high fracture ductility in this test had a tendency that the number of cycles taken to cause defects in the TCT test was large. The wedge bonding peel test is an effective means enabling quantitative evaluation of the mechanical properties of the wedge-bonded portion that are not obtained through the TCT test.

The metal M as a main component of the outer layer is a metal other than copper, which is desirably effective for improving the bondability of bonding wire and preventing the oxidation of copper. For example, Au, Pd, Pt, Rh, Ag, W, Mo, Cr, Ni or the like may be employed. Among them, at least any one of Au, Pd, Pt and Rh is desirable as the metal M. Au has heretofore been successfully used in a number of cases for improvement of adhesion property relative to encapsulating resin, bondability to an electrode and the like, having an advantage that a quality control is easy. As for Pd and Pt, they make it comparatively easy to stabilize ball shapes, enabling a profound effect for improvement of bonding reliability under the TCT test to be obtained. Since Pd leads to a comparatively low material cost, having an excellent adhesion property relative to copper, thus further enhancing a potential as an outer layer. Specifically, when a main component of the outer layer is Pd and the thickness of the outer layer is 0.021 to 0.12 μm, the above effect for improvement of the bonding reliability under the TCT test becomes remarkable, leading to even more excellent wire bondability and operation performance, and thus it has been verified that Pd is also advantageous to improving a yield ratio in mass production with fine wires.

The main component of the core material is copper, and a property thereof is improved by adding an alloy element thereto, depending on component and composition in the copper alloy. When the core material having copper as a main component includes at least one additive element selected from among P, B, Ir, Zr, Bi, Ti, Au, Ag, Sn and rare-earth metals and further a concentration of the additive element(s) relative to an entire bonding wire is in a range of 0.0001 to 0.03 mol % in total, there can be obtained increased effects such that a percent defective in the TCT test is decreased and fracture elongation in the wedge bonding peel test is increased. Specifically, the improvement is noticeable in the wedge bonding peel test. As for an action of these alloy elements, they are considered to effectively act upon the increase in fracture elongation of a bonding wire in the vicinity of the wedge-bonded portion, through control of the processing of a core material and the formation of a recrystallization texture in the manufacture of a wire and the wedge bonding thereof. Further, in the case that the metal M constituting the outer layer is Au, Pd, Pt and Rh, the above-mentioned additive element inside the core material interacts with the metal M due to ball fusion, thereby providing an effect of further improvement of the sphericity when a ball is deformed. It has been found out that with respect to the effect associated with the element addition, the effect is further facilitated in the case where the element is added to the copper bonding wire that is formed with the outer layer, as compared with the case where the element is added to the conventional copper-based bonding wire that is not formed with the outer layer. If the concentration of the additive element is less than 0.0001 mol %, then the above improvement effect is reduced in some instances. If the concentration of the additive element exceeds 0.03 mol %, wrinkled depressions are formed on the surface of the ball, leading to instability of a ball shape in certain instances. Particularly when the metal M of the outer layer is Pd, it has been confirmed that the above alloying effect in the core material can be enhanced, so that the improvement effect in the peel test can be stably secured irrespective of diameters of fine or thick wires and besides the sphericity of a ball can be improved.

If the outer layer contains at least one element selected from among Bi, P, Se and Tl, and the concentration of the elements on a surface of the outer layer is in a range of from 0.01 to 5 mol % in total, flaws on the surface of a wire can be diminished, resulting in a reduced clogging of a capillary to thereby enable the operating life of the capillary to be improved. This is considered attributable to the fact that in the outer layer containing the elements described above, film quality is dense and the surface of the outer layer becomes hardened. If the concentration of the elements on the surface of the outer layer is less than 0.01 mol %, the above improvement effect is reduced in some cases, while if it exceeds 5 mol %, sliding resistance between a bonding wire and a capillary inner wall increases to destabilize a loop shape according to the circumstances.

The cross-sectional structure of a bonding wire according to the present invention can be fundamentally separated into either an outer layer/core material or an outer layer/diffusion layer/core material. The boundary of the outer layer referred to here is defined by a region where a detected concentration of the metal M constituting the outer layer is 50 mol % in total. Thus, the outer layer meant in the present invention is a region outside of the site toward the surface where the detected concentration of the metal M constituting the outer layer is 50 mol %, i.e., a region where the detected concentration of the metal M constituting the outer layer is 50 mol % or more in total. This is based on the finding that the region where the above-mentioned detected concentration is 50 mol % or more acts dominantly upon the wire property that is affected by a diffusion phenomenon at the bonded interface under high-temperature environments such as a TCT test and reflow resistance. Although the above concentration is considered to be comparatively high as a layer interface concentration, yet distinguishing the region of 50 mol % or more concentration from an inner portion of a wire and controlling such region helps not only achieve the effects of the present invention but also manage and organize the overall properties of a wire. As for the concentrations in the outer layer and in the diffusion layer referred to herein, a total concentration ratio of the metal M and copper is employed, using the concentration value obtained by implementing calculation with the exception of nonmetal elements and gas components such as C, O, N, Cl and S in the vicinity of the surface.

An intermediate region between the outer layer and the core material is the diffusion layer, which is a region formed by the interdiffusion of copper of the core material and metal M of the outer layer. The diffusion layer according to the present invention is defined as a region where the detected concentration of the metal M is 10 mol % or more and less than 50 mol % in total in terms of performance or the like. In the region of this concentration range, the concentration of the metal M is low and thus the region functions in a somewhat different manner from the outer layer and the core material. It is more desirable that a bonding wire include such diffusion layer.

It is desirable that the bonding wire include the diffusion layer between the outer layer and the core material; and the outer layer be provided on the core material, and contain the metal M that differs from the core material in one or both of components and composition, and copper, wherein said outer layer is 0.021 to 0.12 μm in thickness, and a region where a concentration of said metal M is 10 mol % or more is 0.03 to 0.2 μm in thickness. If such bonding wire is employed, initial wedge bondability is further improved and reliability of a wedge-bonded portion in a reflow process using a Pb-free solder is even more improved. Here, the region where the concentration of the metal M is 10 mol % or more corresponds to a combined region of the outer layer region and the diffusion layer region.

It is difficult in some cases to improve the wedge bondability and the reflow property at the same time only by providing the outer layer having a specific thickness, and thus, the thickness of the region where the metal M concentration is 10 mol % or more, in other words, the total of the respective thickness of the outer layer and diffusion layer plays a more important role. The reason is presumably that not only the outer layer but also the diffusion layer functions at the bonded interface because a bonding wire is subjected to complex plastic deformation to partly cause a considerable amount of deformation in the wedge bonding. If the region of that concentration range is 0.03 μm or more in thickness, non-stick failure which often becomes a problem in a wedge-bonded portion of the copper-based bonding wire can be further reduced, making it easy to further improve a mass-production yield. Also, as another effect generated when the region of that concentration range is 0.03 μm or more in thickness, cracks and fractures in the wedge-connected portion can be decreased even if thermal strain increases at high reflow temperature. In the reflow process, a semiconductor element is subjected to short-time rise and fall in temperature and therefore, reliability that is somewhat different from that in the TCT test is required for the wedge-bonded portion that is subjected to rapid heating and rapid cooling. This is because if the region of that concentration range exceeds 0.2 μm in thickness, flexural rigidity of a bonding wire gets higher and thus in some cases, loop shape varies more widely. Here, if the diffusion layer is assumed to be a region where the concentration of the metal M is 10 mol % or more and is less than 50 mol %, then the thickness of the diffusion layer alone is desirably 0.009 to 0.18 μm. Preferably, if the region where the concentration of the metal M is 10 mol % or more is 0.04 μm or more in thickness, then reflow resistance can be effectively enhanced even in a sample that is wire-bonded at the low temperatures less than or equal to 180 degrees C. This is because an adequate strength is sometimes difficult to obtain at an initial stage in a wire bonding operation at the low temperature not more than 180 degrees C., lowering the wedge bonding resistance properties as compared to a wire bonding operation performed at the normal temperature of about 250 degrees C.

It is more desirable that the bonding wire include the diffusion layer between the outer layer and the core material; and the outer layer be provided on the core material, and contain the metal M that differs from the core material in one or both of components and composition, and copper, wherein said outer layer is 0.021 to 0.12 μm in thickness, and a region inside said outer layer where a total concentration of said metal M is 90 mol % or more is 0.004 to 0.07 μm in thickness. If the foregoing bonding wire is employed, the storage life of the wire left in the atmosphere can be substantially improved in addition to the improvement of bondability in the TCT test.

Taking an actually stored sample as an example, it has been confirmed that there occurred no non-stick failures of the above-mentioned bonding wire at a wire bonding process even if the bonding wire was left for thirty days or more at normal temperature in the atmosphere. This is a substantial prolongation of the storage life in comparison with the conventional monolayer copper wire which causes the non-stick failure after being left for about five days or so in the atmosphere. If a copper-based bonding wire of which the storage life has expired is used, the non-stick failure may occur in ball bonding or in wedge bonding, and in association therewith, stop of a bonding device caused by malfunction may sometimes become a problem. In view of the advantage that the bonding wire can be left in the atmosphere for a longer period of time, its workability is expected to be improved due to the facts that a guarantee term for the quality of the bonding wire is lengthened and the replacement frequency of wire in practical use, is improved by increasing the number of turns of a wire product.

The concentration of copper is less than 10 mol % in the region where the concentration of the metal M is 90 mol % or more in total, and hence the metal M becomes highly concentrated in the region inside the outer layer. This high-concentration region has a barrier function for blocking the internal penetration of oxygen and the diffusion of copper toward a surface and it has been found out that a concentration for enabling the enhancement of this function is 90 mol % or more. If the region of this concentration range is 0.004 μm or more in thickness, then the barrier function effectively operates to inhibit oxidation and sulfurization, and thus, the storage life can be improved so as to be kept effective for thirty days or more at normal temperature. If it exceeds 0.07 μm in thickness, however, unevenness on a surface of a ball increases or the ball is hardened and thus the shape of a ball bonded portion deteriorates. Desirably, if the high-concentration region is in a range of from 0.008 to 0.06 μm in thickness, the storage life can be extended up to a still longer period. More desirably, if the high-concentration region is in a range of from 0.01 to 0.05 μm in thickness, the storage life is still further improved, enabling the inhibiting of failures in the wedge-bonded portion of a bonding wire after the long-term storage.

The problem resulting from wire oxidation is that its oxidation is accelerated at high temperature in a packaging process. In a bonding process, a stage mounted with a semiconductor is heated at 300 to 500 degrees C. and therefore, the wire bonded through the formation of loop is left at high temperature. In a high pin count LSI whose number of terminals exceeds 500 pins, bonded wires are left at high temperature for more than several tens of seconds in some instances. Some of the bonded portions are left for several days in the atmosphere after bonding, and the progression of initial oxidation is disadvantageous in terms of quality. Surface oxidation of a wire resulting from letting the wire stand at high temperature leads to failures such as deterioration in reliability and difficulty in quality control or the like. By the oxidation of a wire surface, for example, adhesion property between encapsulating resin and a wire surface changes, and as a result, water can easily infiltrate the interface therebetween and thus there occurs the concern about degradation of long-term reliability.

If a semiconductor device bonding wire includes the outer layer of 0.021 to 0.21 μm thickness and the region inside the outer layer where the concentration of the metal M is 96 mol % or more in total is 0.002 to 0.06 μm in thickness, then it is effective for inhibiting the progression of oxidation while the bonding wire connected in a wire bonding process is being mounted on a heating stage. It has been found out that high-temperature oxidation is difficult to reduce only by the management of the outer layer thickness, but the composition of the outer layer, specifically the region where the concentration of the metal M is considerably high functions to inhibit the oxidation. If a high-concentration region where the metal M is 96 mol % or more in concentration is present inside the outer layer, enhanced effects can be exerted which simultaneously prevent oxygen from infiltrating inward a wire, and copper from diffusing into a surface of the wire even under high temperature heating. If the region where the metal M has a concentration of 96 mol % or more is 0.002 μm or more in thickness, a wire can be prevented from being oxidized while it is being heated on a stage. On the other hand, if the region exceeds 0.06 μm in thickness, the sphericity of a ball that had been melted and then solidified gets unstable to arouse concern about decrease of productivity. Preferably, if the high-concentration region where the metal M is 96 mol % or more in concentration is 0.004 to 0.05 μm in thickness, a profound effect can be exerted that even when using a thick wire used for a power system IC or the like and having a diameter of 35 μm or more, its high-temperature oxidation is restrained. This high-purity region does not always have to be positioned on the uppermost surface of a wire but may exist inside the outer layer, thus allowing the above effects to be exerted. Preferably, the high-purity region may be located in the vicinity of the surface of the outer layer, and more specifically may be located nearer to the surface of the outer layer than a position at half the thickness of the outer layer, thus achieving a remarkable effect for suppressing the high-temperature oxidization.

In order to adapt to diversified LSI packaging structures and interconnecting technologies, even for a bonding wire having such comparatively thick outer layer as 0.021 to 0.21 μm thick, further performance gains are sometimes required in respect of sliding performance, surface scraping reducing performance and unreeling performance. The deterioration of the sliding performance between a capillary through-hole and a wire surface deteriorates causes a loop shape to vary widely. With respect to the surface scraping, flaws and scrapings are generated on the surface of a wire in the process of loop control to cause the clogging of a capillary through-hole and short-circuiting due to the scrapings coming in contact with adjacent wires, thus giving rise to the practical troubles. When the unreeling performance deteriorates, in the case of reeling a wire out of a spool, the wire is subjected to deformation such as wire bending, degrading the linearity of the loop shape of the wire bonded, and when the unreeling performance remarkably deteriorates, the wire may be broken to stop a reeling device in some cases. By further improving these surface properties, stable mass-production can be ensured as a result of satisfying the latest packaging needs requiring the strict loop control, such as that needed in fine pitch connection and multi-tier bounding.

It has been found out that in order to improve such performances attributable to the surface properties of a wire as these sliding performance, surface scraping reducing performance and unreeling performance, it is effective to form a region in the surface of the outer layer where nonmetal elements such as carbon, oxygen or the like are concentrated. This is because it is difficult to solve the problems described above only by regulating the components and compositions of metal elements that make up the core material and the outer layer. It has been confirmed that the effects of these nonmetal elements in the surface are associated with the thickness of the outer layer. If the outer layer is 0.021 to 0.12 μm in thickness as described above, the control of nonmetal elements including carbon, oxygen or the like effectively operates. Although the detailed mechanism is still unclear, this is presumably due to such mechanism that if the thickness is as thin as 0.021 μm or less, then the mechanical property or the like of the core material has a major influence thereon, but if the outer layer is considerably thick, i.e., as thick as 0.12 μm or more, then the strength and metal texture of the outer layer function dominantly and thus it is difficult to improve the performances by controlling the nonmetal elements in the surface of the outer layer.

As far as the concentration calculation of carbon and oxygen is concerned, it is calculated based on the total of the metal elements such as copper, the metal M and the like and the nonmetal elements such as carbon, oxygen, nitrogen and the like. On the other hand, when calculating the concentration of the metal M and copper which make up the outer layer and the core material, a concentration value is used that is calculated based on the total of only the metal elements, excluding nonmetal elements such as carbon, oxygen or the like in the vicinity of the surface. By utilizing these two methods for calculating the concentration as the situation demands, the associations with performances under actual use can be made clearer. Carbon and oxygen are concentrated in a certain region in the surface and such region only exists in the vicinity of the surface defined from the uppermost surface to the depth direction of up to 0.01 μm or less, and carbon and oxygen are not contained inside the outer layer nor in the core material. Properties affected by carbon and oxygen are limited mainly to sliding performance, surface scraping reducing performance, unreeling performance or the like. Most properties (the TCT test, the reflow resistance, the wedge bondability, the ball bondability or the like), described in association with the foregoing metal M, copper and part of the alloying elements serving as main components of the outer layer and the core material, are governed by the composition and components of the metal elements including the metal M and copper. It has been ascertained that carbon and oxygen have a less direct effect thereon.

If a semiconductor bonding wire includes the outer layer of 0.021 to 0.12 μm in thickness, the carbon concentration of 15 to 80 mol % on the outermost surface of the outer layer, and the region where the carbon concentration is 5 to 80 mol % in the depth direction from the surface thereof (hereinafter called a carbon concentrated region), the sliding performance on the surface of the bonding wire is enhanced to stabilize a loop shape, and thus flaws and scraping-off, of the bonding wire can be restrained. The reason for limiting the carbon concentration on the outermost surface of the outer layer is that the carbon concentration of 15 mol % or more can contribute to improving the sliding performance while in certain instances, it becomes an issue that if the carbon concentration exceeds 80 mol %, then the bonding performance of the wire deteriorates, resulting in the degradation in continuous bonding performance. At least part of a high-concentration-region of carbon in the range of 5 to 80 mol % exists as an organic film and thus is expected to fulfill a buffer function sufficient to reduce the friction between the capillary through-hole and the surface of the wire. If the high-concentration-carbon region is 0.0004 μm or more in thickness, the buffer function for enhancing the sliding performance is expected to be produced, while if it exceeds 0.01 μm in thickness, the continuous bonding performance deteriorates and it becomes an issue to cause a non-stick failure particularly in a thin wire of 20 μm or less in diameter. Desirably, if the high-concentration-region of carbon is 0.0007 to 0.007 μm in thickness, then a bonding velocity can be accelerated due to effects of suppressing flaws and scrapings of a wire which result from improving the sliding performance, an effect of widening a manufacturing margin in wedge bonding or the like, thus achieving further contribution to improving productivity.

As methods for controlling the foregoing carbon concentration in the surface of the outer layer, it is effective, e.g., in a wire manufacturing process that adjustments of a lubricating liquid, a wire drawing velocity, cleaning, drying time or the like in a wire drawing process, or adjustments of the application of a corrosion-proof agent and a lubricating agent, an immersing condition, cleaning, dying or the like in an annealing process, are selected as the need arises and thus are optimized. Above all, it is effective that in the middle of or at the end of the processes such as wire drawing, wire annealing or the like, the corrosion-proof agent, a surface acting agent or the like are applied onto the surface of the wire. By optimizing embrocation conditions (solvent, solvating media, concentration, temperature, immersion time and immersion velocity), cleaning conditions (temperature, immersion time), drying conditions (gas, temperature, air volume) or the like, the above high-concentration-region of carbon in the surface of the outer layer can be controlled. With respect to the corrosion-proof agent, there are many choices according to the components and composition of the outer layer. A corrosive-proof agent for copper such as triazole, benzotriazole, imidazole or derivatives from these chemicals or the like is also available. Besides, there are many kinds of lubricating agents added into a liquid tank in the wire drawing process. For the composition thereof, however, mixing oil, soap, a surface acting agent or the like is basically necessary, and it becomes important to optimize the selection of these main components and a compounding ratio thereof. By classification in terms of addition and modification of processes, the addition and modification of process, for highly reproducible and precise concentration management, can be classified into the following cases: one is an addition of process that adds a new process focused on controlling the carbon concentration on the surface, and the other is a modification of the existing wire manufacturing process where the existing process is subjected to slight improvements and conditional changes or the like in order not to increase the number of production processes with manufacturing cost given the priority. In either case, a region having a desired carbon concentration can be formed by comprehensively optimizing the processes.

The wire unreeling performance is one of the basic performances under actual use, but a dominant factor thereof in the multilayer copper wire still remains unclear in a number of respects. Typically, a 200 to 3,000 m-long wire is wound around a spool with a certain degree of tension applied thereto, and then shipped under that wound condition. Then, the spool is mounted on a bonding device to perform continuous bonding with the spool being rotated to unreel the wire. If the unreeling performance of the wire deteriorates, there occur the failures of a circular-arc-shaped curling of a wire and the failures of a bending of a wire that is plastically deformed in a dogleg manner, leading to the problems such as degradation in loop linearity and occurrence of wire fractures. On the other hand, if the priority is given only to unreeling performance and a winding tension is excessively weakened, there will occur a loosening of the winding, leading to another problem that the whole of the wire wound around the spool becomes unusable.

A wire wound around the spool in a manner biting thereinto, loosening of the wire wound around the spool, and wire adhesion often cause deterioration of the unreeling performance of the multilayer copper as main factors thereof. It has been found that in order to suppress these failures, an oxygen concentration in the surface of the wire can be effectively controlled. By controlling the oxidation of the surface of the outer layer, wire sliding, wire friction or the like are subjected to fine adjustment while restraining metal joining that is restrained between outer layers in the vicinity of interfacial faces on which the outer layer of the wire wound around the spool contacts, thereby improving the unreeling performance. At the same time, if an oxidized film becomes excessively rigid, the risk of damaging the bondability acts as the advantage of the multilayer copper wire is involved and therefore, the management of an oxygen concentration and film thickness becomes important. Though only a single oxidized film is formed, the unreeling performance can comprehensively be difficult to improve and therefore an oxygen concentration on the outermost surface and in the depth direction can be effectively optimized. Further, an appropriate condition of surface oxygen varies depending even on the thickness of the outer layer of the multilayer copper wire and hence it is important that the thickness of the outer layer, a surface oxygen concentration, and an oxygen concentration in the depth direction are comprehensively optimized.

If a semiconductor bonding wire includes a region where the outer layer is 0.021 to 0.12 μm in thickness, the outermost surface of the outer layer is 1 to 25 mol % in oxygen concentration, and (hereunder, referred to as an oxygen concentrated region) the surface of the outer layer is 0.2 to 25 mol % in oxygen concentration, is 0.0005 to 0.007 μm, the improvements in unreeling performance from a spool, loop linearity and wire bondability or the like can be realized at the same time. The reasons for this fact are that if the outermost surface is less than 1 mol % in oxygen concentration, the bonding failure of mutual outer layers (heating bond failure) occurs, while if exceeding 25 mol % in oxygen concentration, bonding performance of a thin wire deteriorates. The oxygen concentrated region whose oxygen is 0.2 to 25 mol % in concentration, effectively operates for suppressing a breaking-into action in a contact portion between outer layers and the bonding failure. If oxygen concentrated region is less than 0.0005 µm in thickness, an effect for improving the unreeling performance is less and if exceeding 0.007 µm in thickness, then the bondability deteriorates.

As the above method for controlling the oxygen concentration on the surface of the outer layer, an oxidization degree of the outer layer in the wire manufacturing process is effectively adjusted. Adjustments of, e.g., the regulations of cleaning, drying or the like in the wire drawing process and the adjustments of thermal history, a flow volume of an atmospheric gas, annealing time, an atmosphere in cooling or the like are effectively selected and optimized as needed. Further, the annealing process and the wire drawing process are combined to comprehensively optimize the processes and thus a desired oxygen concentration region is advantageously formed. Above all, it is effective for controlling the oxygen concentrated region on the surface of the outer layer that a heating condition (temperature distribution inside a furnace, a drawing velocity) in the annealing process and a cooling condition (a gas type, a flow volume, shielding performance) are optimized. Further, a wire drawing process→an annealing process→a wire drawing Process→an annealing process are performed in the order mentioned above and by combining the optimization of the annealing and wire drawing processes as described above, the reproducibility can be improved in controlling the oxygen concentration in the depth direction. By classification from the standpoint of adding and modifying processes, in order to manage the highly reproducible and high precise concentration, this classification approach can be classified into an approach of newly adding a process focused on control of the oxygen concentration on the surface, an approach of satisfying a certain improvement and certain alternation of condition in the current wire manufacturing process for the purpose of giving priority to manufacturing cost not to increase a process.

If a bonding wire includes a region where a concentration of the metal M which makes up the outer layer and is other than copper in the whole of a wire is 0.05 to 3 mol % in total, by a property that a ball is prevented from hardening in addition to the improvement in long-term reliability in the TCT test, advantages are given for an increase in bonding strength, a reduction in sweep-out behavior (failure in aluminum splashing) of an aluminum electrode material toward a periphery of the ball and in chip damage. In certain instances, it becomes a practical issue that a ball on a copper-based bonding wire tip is hard and besides work hardening in deformation is high and therefore, an aluminum electrode is swept out in bonding a wire to induce short-circuiting between its electrode and an adjacent electrode and a chip located directly below a bonded portion is damaged. By holding down the concentration of the metal M in the whole of a wire, even if the metal M is solid-dispersed in a ball, a degree of hardening can be restrained. Here, if the concentration of the metal M in the whole of the wire is 3 mol % or less in total, an effect of reducing splashing of aluminum can be achieved by suppressing the hardness of the ball and more desirably if being 2 mol % or less, an effect for suppressing the sweep-out behavior of aluminum is obtained, providing a good bonding result. If the metal M is 5 mol % or less in concentration, it becomes difficult in some cases to stably realize in a mass-production process keeping the above outer layer at 0.021 to 0.12 µm in thickness.

Such a semiconductor bonding wire including a diffusion layer between an outer layer and a core material is more desirable that includes the outer layer provided on the core material, copper, the metal M with difference in component and/or composition from those of the core material, the outer layer of 0.021 to 0.21 µm in thickness and a copper concentration of 0.5 to 45 mol % on the outermost surface of the outer layer. By utilizing this bonding wire, a sufficient effect is achieved to reduce the failure of misalignment of a ball bonded portion. The mass productivity is enhanced even in a chip with fine pitch wiring where the spacing between ball bonded portions is narrow. Here, the concentration on the outermost surface means a concentration in a region of 2 nm in depth from the surface.

If the outermost surface of the outer layer exceeds 45 mol % in copper concentration, due to the nonuniformity of distribution, expanse of arc discharge and melting only one end of a bonding wire in preference, the misalignment of a ball takes place in forming the ball in some instances. Arc discharge has a profound effect on the outermost surface, besides copper and the metal M are different in electron emission, leading in a certain case to a change in ball shape depending on the copper concentration on the outermost surface of the wire. If the outermost surface is 0.5 mol % or more in copper concentration, an effect for reducing the failure of eccentricity is exerted. Desirably, if the outermost surface is 0.5 to 30 mol % in copper concentration, improper shapes such as an irregular shape, a petaline shape or the like can be more effectively restrained even in a small ball of a diameter less than twice the wire diameter. More desirably, if the outermost surface is 0.5 to 20 mol % in copper concentration, the sphericity in a small ball is more improved, militating for a fine pitch wiring.

If a semiconductor bonding wire includes a region (hereunder, referred to as a copper concentrated region) where the outer layer is 0.021 to 0.12 µm in thickness, the surface of the outer layer is 1 to 30 mol % in copper concentration is 0.0005 to 0.008 µm in thickness, the eccentricity is restrained in forming a ball and a shrinkage cavity of a ball end and minute irregularities on a ball surface can be reduced and further a pressure-bonded ball shape is stabilized and furthermore a variation in ball bonding strength is reduced, thus permitting mass productivity to be improved. Effects are considered to be exerted in which since there exists a region where copper is concentrated on the surface of a wire, the expanse of arc discharge is stabilized and the mixture of copper and metal M in melting and solidifying of a ball is advanced in a short time. If the region where the surface of the outer layer is 1 to 30 mol % in copper concentration, the above effects are expected. The reason for this is that if the region where the copper concentration is dense and is 0.0005 µm or more in thickness, an effect can be achieved which suppresses shrinkage cavities and minute irregularities. So, if exceeding 0.008 µm in thickness, eccentricity occurs to lead to the potential for making a ball shape slightly unstable.

There is no problem even if a structure of the copper concentrated region contains an alloy of the metal M and copper or cuprate. Further, even when the cuprate described secondly has been formed, at least parts of the copper concentrated region and oxygen concentrated region are overlapped to thereby achieve profound effects of suppressing the shrinkage cavities and minute irregularities in forming a ball and of improving the unreeling performance at the same time. The copper concentrated region not always has to be located on the outermost surface and is also effective even if existing inside the outer layer. Desirably, the copper concentrated region is located in the vicinity of the surface of the outer layer and specifically is located on a more surface side of the outer layer than quarter thickness of the outer layer to thereby achieve a remarkable effect for suppressing the high-temperature oxidization. A carbon concentrated region and the copper concentrated region, e.g., are formed on the outermost surface of the outer layer and on its lower layer, respectively and as a result, striking effects can be achieved which satisfies both of forming a good ball, suppressing the scraping and a flaw on the surface of the wire.

As approaches for analyzing the concentrations of the outer layer, diffusion layer and core material, effective are the approach for performing analysis by digging down from a surface of a bonding wire into its depth direction using a spattering method, or an approach for analyzing a line or a spot on a cross-sectional surface of the bonding wire. The first approach is effective in the case of a thin outer layer and, however, when the outer layer is thick, it takes an excessively long time to measure the concentration. The second approach is effective when the outer layer is thick and has advantage that it is comparatively easy to check the concentration distribution of an entire cross-sectional surface and reproducibility in several points. When the outer layer is thin, however, the measurement accuracy deteriorates in the second approach. Another approach is also possible in which a wire is slantly ground to enlarge thickness of a diffusion layer for measuring the concentration. Line analyzing is comparatively simple in a cross-sectional surface. When analytical precision is desired to improve, however, it is also effective to narrow an analyzing spacing in the line analyzing and analyze a spot by limiting a region desired to observe by confining to the vicinity of an interface. As an analyzing equipment used for these concentration analyses, utilized are an electron probe microanalysis (EPMA), an energy disperse X-ray analysis (EDX), an Auger spectroscopy analysis (AES) and a transmission electron microscope analysis (TEM) or the like. The AES has a high special resolution in particular and hence is effective for the concentration analysis in a thin region on the outermost surface. For the research of an average composition, it is also possible to proceed to melt, by acid or the like, a layer from its surface thereinto in incremental steps and thus enable a composition of the melted portion to be determined from a concentration of matter contained in the acid solution.

It is effective that an intermetallic compound phase mainly containing copper and the metal M in addition to the presence of the concentration gradient is contained in the outer layer. In a bonding wire which is composed of the core material primarily containing copper, and the outer layer made of the metal M and contains a portion with the concentration gradient of copper and one or more layers of the intermetallic compounds primarily containing copper and the metal M, the intermetallic compounds improves the mechanical characteristics such as strength and coefficient of elasticity of the bonding wire to become more effective for improving the loop linearity and suppressing a wire shift in encapsulating.

While manufacturing the bonding wire according to the present invention, a process for forming the outer layer on the surface of the core material, working and thermal treatment processes for controlling the outer layer, the diffusion layer and the core material is required. In order to control the outer layer, the composition of the core material and thickness, in the above processes for forming the outer layer, management of the thickness and the composition are first needed to manage at an initial stage of forming the outer layer.

Methods for forming an outer layer on the surface of the core material made of copper include a plating method, an evaporation method, a melting method or the like. As the plating methods, any one of an electrolytic plating method and electroless plating method may enable manufacturing. In the electrolytic plating methods called a strike plating method and a flash plating method, their plating velocities are high and adhesion property with a ground is good. Solutions used for the electroless plating method are classified into a substitutional type and a reductive type. When a film is thin, only the substitutional type is sufficient, while when thick film is formed, after the substitutional type plating has been applied, the reductive type plating is effectively applied in a stepwise fashion. The electroless plating method needs a simple device, but it takes a longer time than does the electrolytic plating method.

As the evaporation methods may be used physical adsorption methods such as a spatter method, an ion plating method, a vacuum deposition method or the like and chemical adsorption methods such as a plasma CVD method or the like. Any methods are of dry type and therefore a cleaning operation after a film has been formed is not needed, thus eliminate a likelihood of surface contamination in cleaning.

In a stage of applying plating or deposition, effective are both the approach of forming a film of the metal M with a target wire diameter aimed thereby and an approach of drawing a wire more than once till a target wire diameter is obtained after having formed a film on a thick-diameter core material. In forming a film with the final wire diameter aimed in the first approach, the manufacturing, the quality control or the like are simple and in a combination of film forming and wire drawing in the second approach, this approach is advantageous to improve adhesion property of the film and core material. As specific examples for each of the approaches, possible are an approach of forming a film on a copper wire so as to be formed with a target diameter with the copper wire continuously drawn within an electrolytic plating solution and an approach of drawing a wire so as to be formed with a final diameter after having immersed a thick copper wire in a plating bath for electrolytic or electroless plating, to form a film.

In a working process after having formed the outer layer, rolling, swaging, die wire drawing are selected for different purposes and then are used for each purpose. If defects in a processing composition, transportation and crystal grain interface are controlled by a processing velocity, a pressure applying ratio or a die face reducing ratio, a composition of the outer layer and adhesion property are affected by the control.

In a thermal treatment process, on an interface between the outer layer and the core material, the mutual diffusion between copper and the metal M is promoted. Depending on purposes, the thermal treatment is effectively practiced once or more. In order to obtain the desired film thicknesses in the compositions of the outer layer and diffusion layer, a manufacturing technology is required which controls a concentration in % order and film thickness in nm order with severe precision. The thermal treatment processes are classified into an annealing process immediately after the formation of a film, an annealing process in mid-course of a process and a finishing annealing process with a wire formed with a final diameter and then, it is important to select these processes to be used Only by heating a wire, the distribution of copper on a surface and inside of the outer layer cannot be controlled. Even if processed strain that eliminates annealing is directly applied at a final diameter of a wire used in a typical wire manufacturing, adhesion property between the outer layer and the core material deteriorates thereby, loop control becomes unstable and it is difficult to control the homogeneity of the outer layer in a longitudinal direction of a wire also the distribution of the outer layer and diffusion layer in a cross-sectional surface of a wire. Then, it is important to control thermal treatment timing, temperature, velocity, time or the like.

By combining the processing and the thermal treatment to control a degree of progress of the diffusion, it becomes possible to control a film thickness, a composition and a structure which are desired. The processing history before the thermal treatment relates to the composition in the interface between the outer layer and the core material and therefore, has an effect on diffusion behavior in the thermal process. Depending on at which processing stage the thermal treatment is applied, the final compositions, thickness of the outer layer and diffusion layer vary. It has been verified that for one example, in a bonding wire produced in the process where after having had applied intermediate annealing in mid-course of the process, the wire was drawn and finishing annealing was applied with final diameter of the wire formed, the compositions of the outer layer and diffusion layer and the concentration gradient changed.

As for the thermal treatment, the wire is subjected to the thermal treatment with the wire being continuously drawn and besides the temperature inside a furnace is not maintained at a constant temperature, unlike the general thermal treatment, and then a temperature gradient is created inside the furnace. As a result, the bonding wire with the outer layer and the core material, which are the features of the present invention, can be easily mass-produced. Specific examples include a method for locally introducing a temperature gradient, a method for varying temperature inside a furnace, etc. When the surface oxidization of the bonding wire is restrained, the wire is also effectively heated while allowing inert gases such as $N_2$, Ar or the like to flow inside the furnace.

In the method of adopting the temperature gradient, it is effective to make the temperature gradients in a plurality of regions such as a positive temperature gradient near the inlet port of the furnace (the temperature rises toward a wire drawing direction), a stable temperature region, and a negative temperature gradient near the outlet port of the furnace (the temperature falls toward the wire drawing direction). As a result, the adhesion property is allowed to improve without generating peeling or the like between the outer layer and the core material near the inlet port of the furnace and then, copper and the metal M are encouraged to diffuse in the region of stable temperature to thereby form a desired concentration gradient, and further by restraining excessive oxidization on a surface of copper near the outlet port of the furnace, it is possible to improve bondability and loop control property of the obtained bonding wire. In order to achieve these effects, it is desirable to provide a temperature gradient of 10 degrees C./cm at the inlet and outlet ports.

In a method for varying temperature, it is effective that an inside space of the furnace is divided into a plurality of regions and a temperature distribution is created by performing different controls of temperatures in each of the regions. The inside space of the furnace, e.g., is divided into three or more portions to control their temperatures independently and both ends of the furnace is allowed to be lower than the central portion thereof in temperature, thereby realizing the same improvement effect as done by the method of adopting the temperature gradient. In order to suppress the surface oxidization of the bonding wire, a low-temperature at which an oxidation rate of copper becomes slow is set in the outlet port of the furnace and thus, bonding strength of the wedge-bonded portion can be increased.

Further, a melting method is one in which any one of the outer layer and the core material is melted to be cast and has advantages in which productivity is excellent by performing wire drawing after having connected the outer layer and the core material at a thick-diameter wire of on the order of 1 to 50 mm and a design for alloy components of the outer layer is easy when compared to plating, an evaporation method and further property improvements in strength, bondability or the like are easy to realize. Specific processes of the melting method are classified into a process for casting molten copper or the metal M molten to form an outer layer around the core material made in advance and a process for forming a core material by casting a molten copper or a molten copper alloy in the center of a hallow column of the metal M made in advance. Desirably, the process for casting a copper core material inside the hollow column as secondly described can easily and stably form a copper concentration gradient in the outer layer. Here, if a small quantity of copper is allowed to be contained in the outer layer made in advance, the copper concentration can be easily controlled on the surface of the outer layer. Besides, in the melting method, although the heat treatment for diffusing copper into the outer layer can be omitted by applying the heat treatment to adjust the copper distribution inside the outer layer, a further improvement in property can be expected.

Further, by using a molten metal like this, at least any one of the core material and the outer layer can also be manufactured by continuous casting. The continuous casting permits a process to be simplified as compared to the above casting method and permits a wire to be small in diameter, allowing the productivity to be improved.

It has been verified that as a bonding method for the conventional multilayer copper wire including the outer layer and the core material according to the present invention, even if a pure $N_2$ gas was employed as a shield gas in forming a ball, good ball bondability could be obtained. Namely, there is provided a bonding method that uses a bonding wire, including the core material with copper as its main component, the outer layer which is provided on the core material including the metal M whose component and/or composition are/is different from those of the core material, and copper and has the outer layer of 0.021 to 0.12 μm in thickness, and then generates arc discharge to form a ball with a $N_2$ gas of 99.95 vol % or more in purity sprayed to a wire's tip or its surroundings and then forms a ball to bond. In the bonding method, as substitute for a 5 vol % $H_2+N_2$ gas, being a standard gas, an inexpensive pure $N_2$ gas is used and thus the running cost is reduced, promoting a copper-based bonding wire to be put to practical use.

As a shield gas used to form a ball of the multilayer copper bonding wire according to the present invention, even if the standard 5 vol % $H_2+N_2$ gas is employed, good bondability can be obtained. A pure $N_2$ gas, however, can provide the same good property. If the outer layer is as thin as 0.021 μm or less, it becomes a problem that the use of the pure $N_2$ gas generates an eccentric ball. If exceeding 0.12 μm in thickness, wrinkle-shaped protrusions and tiny holes are generated on the surface of the ball when the pure $N_2$ gas is used, making it difficult to obtain a smooth surface of the ball. One advantage of having selected this thickness is that the outer layer with 0.021 to 0.12 μm in thickness contributes to good ball forming performance. If the outer layer is 0.035 μm or more in thickness even within the above range of thickness, the sphericity of a ball is more enhanced. The reason why the purity of 99.95 vol % or more is selected for the pure $N_2$ gas is that this purity is within a warranty scope of the $N_2$ gas available at an industrially inexpensive price.

Usually, it is assumed that mixing the 5 vol % $H_2$ gas leads to an effect exerted on the stability of arc discharge and on the inhibition of the oxidization of a molten ball. In contrast, when a bonding wire is melted to form a ball, if the outer layer of a monolayer wire or a conventional multilayer wire is thin, within the pure $N_2$ gas, arc discharge becomes unstable and the oxidization of copper preferentially proceeds, causing a ball shape to be unstable. Meanwhile, if the thickness of the outer layer is within the range according to the present invention, even in the pure $N_2$ gas, the metal M near a surface stabilizes arc discharge, further the outer layer preferentially melts to play a protective role and thus the oxidization of a ball is considered to be preventable. It has been proved that according to a bonding condition, the bonding strength of a ball bonded in the pure $N_2$ gas became higher than in the 5 vol % $H_2+N_2$ gas in certain instances.

Further, the formation of a ball in the pure $N_2$ gas tends to vary depending also on a type of the metal M constituting the outer layer. Above all, when the metal M constituting the outer layer includes at least one element selected from among Au, Pd, Pt and Rh as its main component, it has been proved that in the pure $N_2$ gas, it was comparatively easy to improve the sphericity and stabilize a ball size.

EXAMPLES

Next is a description of examples of the present invention.

As a raw material of a bonding wire, copper used for a core material was 99.99 mass % or more in purity, being a high-pure raw material. As raw materials of Au, Pd, Pt, Ag, and Rh in the outer layer, those of 99.99 mass % or more in purity were prepared.

A copper-based bonding wire which had been made thinner to a certain diameter was employed as the core material and in order to form a layer of a metal M different from copper on the surface of the wire, an electrolytic plating method, an electroless or non-electrolytic plating method, an evaporation method, melting method or the like were practiced. In order to form a concentration gradient, heat treatment was applied. A method of forming the outer layer at a final wire diameter and a method of thinning a wire to its final diameter by applying a wire drawing process, after having formed the outer layer at a certain diameter were employed. As an electrolytic plating liquid and an electroless plating liquid, a commercially available plating liquid used for semiconductor was employed and as the evaporation method, a spatter method was employed. Bonding wires with about 30 to 2,500 μm in diameter were prepared in advance and a surface of the wire was coated using deposition and plating and then the wire was drawn to its final diameter of 15 to 50 μm and finally a processing strain was removed and heat treatment was applied so that a stretch rate became 5 to 20%. A wire drawing velocity was applied within 5 to 100 m/min. As needed, a small amount of a commercially available copper wire drawing lubricant agent was added to a wire drawing liquid. If needed, a die-wire-drawing process was applied to obtain a wire diameter of 30 to 100 μm and afterward a diffusional heat treatment was applied and then a wire drawing process was further applied.

When the melting method was utilized, a method for casting a molten metal around the core material made in advance and a method for casting molten copper or a molten copper alloy in the center of a hollow column made in advance were adopted. Thereafter, processes including forging, rolling, die-wire-drawing and heat treatment were applied, thus manufacturing the bonding wire.

In heat treatment of the wire according to the present invention, the wire was heated with the wire being continuously drawn. A method for introducing a local temperature gradient and a method for varying temperature inside a furnace were utilized. For heat treatment furnace were employed, e.g., converted so as to divide temperatures inside the furnace into three temperatures and then enable control of the temperatures. The temperatures inside the furnace were set as 200 to 700 degrees C. and a wire drawing velocities were adjusted within 10 to 500 mm/min. The temperature was, for one example, set to attain such distributions as to be high, medium and low temperatures or medium, high and low temperatures from a wire inlet port to a wire outlet port and each heating time length was managed. In conformity with the temperature distribution, the wire drawing velocities were optimized. For the purpose of suppressing the oxidization in the atmosphere in the heat treatment, inert gases such as $N_2$, Ar or the like were utilized. A gas flow volume was adjusted within 0.0002 to 0.004 $m^3$/min to be utilized for temperature control inside the furnace. As timing for performing heat treatment, two methods were adopted to prepare samples. One method was one in which a plating layer was formed after heat treatment had been applied to a copper wire posterior to a wire drawing process and another method was one in which heat treatment was performed twice after heat treatment and after the wire drawing process.

When controlling an oxygen concentrated region on the surface of the outer layer, heating conditions (temperature distribution inside a furnace, a wire drawing velocity) and cooling conditions (a gas type, a gas flow volume and shielding performance) were optimized. In order to control, e.g., the atmosphere inside the furnace and near the inlet and outlet ports of the furnace, two or more gas inlet ports were provided. By adjusting each inlet position, an inflowing direction, a gas flow volume or the like, oxygen partial pressure inside the furnace and temperature distribution were regulated. The gas flow volume was adjusted within 0.0002 to 0.004 $m^3$/min. Further, since in some instances, a wire is heated in the remaining heat region near the outlet port of the furnace to be oxidized, it was also needed to control the atmosphere in a cooling zone posterior to the heating zone.

When controlling a carbon concentrated region on the surface of the outer layer, coating by immersing the wire in a solution containing a small quantities of a rust retardant and surface acting agent, cleaning and drying of the wire were continuously performed after the above heat treatment. As a coating agent used here, a solution which was produced by mixing several types of solutions obtained by blending the rust retardant and surface acting agent with distilled water so as to become 1 to 20 vol % in total concentration in the distilled water, was employed. The cleaning was practiced basically by the distilled water and the distilled water to which alcohol was partially added was utilized as needed. When an effect of removing the coating agent excessively adhered was needed to enhance, the coating agent was heated to the temperatures ranging from 30 to 50 degrees C. In drying, dried air or a $N_2$ gas was blown to the wire. If needed, after having drawn the wire to 30 to 100 μm in diameter, the heat treatment and the coating process were applied, then a wire drawing process was applied and further the heat treatment and the coating process were again applied with the wire of given final diameter. One of the effects caused by this two-times heat treatment is that it is effective for controlling the distribution of the carbon concentration in the depth direction with the outermost carbon concentration kept as low.

The depth analysis according to AES was employed for measuring film thickness of the surface of the wire and a surface analysis and a line analysis according to AES and EPMA were implemented to observe an element analysis such as the concentrated state in a grain interface. In the depth analysis according to AES, a measurement was performed in the depth direction while practicing a spattering operation using Ar ions and then a unit of depth was displayed by $SiO_2$ conversion. The concentration of the metal M in the bonding wire was measured by an IPC analysis and an IPC mass analysis.

For connecting a bonding wire, a commercially available automatic bonder was employed to practice ball/wedge bonding. A ball was created on a wire tip by arc discharge and the created ball was connected to an electrode film on a silicon substrate and the other end of the wire is wedge-bonded on a lead terminal. As a shielding gas used to suppress oxidation in forming a ball, the standard 5 vol % $H_2+N_2$ gas and the pure $N_2$ gas were employed. For the purpose other than evaluating a ball shape, the standard 5 vol % $H_2+N_2$ gas was fundamentally employed. The gas flow volume was adjusted within 0.0003 to 0.005 m$^3$/min.

As the other side of bonding, a 1 μm thick Al alloy film (an Al film containing 1 mass % Si and 0.5 mass % Cu, another Al film containing 0.5 mass % Cu) was employed. At the same time, as the other side of wedge-bonding, a lead frame whose surface was Ag-plated (1 to 4 μm in thickness) or a resin substrate of an Au-plated/Ni-plated/Cu-plated electrode structure was employed.

With respect to ball forming performance, as the shielding gas used to suppress oxidization, the comparison was performed between the standard 5 vol % $H_2+N_2$ gas (fed from a high-pressure bomb and its purity was 5N-up) and the pure $N_2$ gas (fed from a concentrated piping and its purity was 4N). In the evaluation of an initial ball shape, ratio of a wire diameter to a ball diameter was defined as 1.7 to 2.0. A thirty pieces of balls before bonding were observed by a scanning electron microscope (SEM) and an optical microscope to evaluate a surface texture, a shape and dimensional precision. The mark x denotes the experimental result that 3 or more abnormal-shaped balls were generated to indicate the failure and therefore improvement was required. The mark Δ denotes the experimental result that although the two or less abnormal-shaped balls were generated, unevenness on the surface was large or the number of balls whose eccentricities from the bonding wires were pronounced was 5 or more. The mark ○ denotes the experimental result that two to four balls whose eccentricities from the bonding wire were generated and the degree of the eccentricities were small and therefore it was judged that no large practical issue arose. The mark ● denotes the experimental result that one or no ball whose eccentricity generated was found and its dimensional precision was good, the ball formation was judged to be good. These marks were entered in a column "ball forming performance" of a table 2.

In the judgment of a bonded shape of a pressure-bonded ball, observing 5,000 bonded balls, the sphericity and dimensional precision of each of the ball shapes were evaluated. Each of the two cases was evaluated. In one vase, a normal-size ball was formed whose ratio of an initial ball diameter to a wire diameter was 1.9 to 2.2, while in another case, a small-diameter ball was formed whose ratio of an initial ball diameter to a wire diameter was 1.5 to 1.7. The mark x denotes the experimental result that 5 or more defective ball shapes such as an irregular shape departed from sphericity, a petaline shape or the like were generated and therefore, the balls were judged to be defective. The mark Δ denotes the experimental result that 2 to 4 defective ball shapes were generated and therefore it was desirable to improve the ball bonded shapes as needed. The mark ○ denotes the experimental result that one or no defective ball shape was generated and therefore the ball shape was judged to be good. These marks were entered in a column "ball bonded shape" of the table 2.

The evaluations of a shrinkage cavity of an initial ball and minute unevenness of a pressure-bonded ball were judged in a comprehensive manner by the SEM observation of 20 initial ball tips and by observing 300 bonded balls. The mark x denotes the experimental result that any one of cases was found, where 8 or more shrinkage cavities and 30 or more ball bonded portions where minute unevenness that was generated were found and therefore, the balls were judged to be defective. The mark Δ denotes the experimental result that 2 to 7 shrinkage cavities were generated or 4 to 29 ball bonded portions where minute unevenness was generated were found and therefore, it was desirable to improve the defectives as needed. The mark ○ denotes the experimental result that no shrinkage cavity was generated and 3 or less ball bonded portions where minute unevenness was generated were found and therefore the balls were judged to be good. These marks were entered in a column "shrinkage cavity and surficial unevenness" of the table 2.

The evaluation of Al sweep-out behavior of a ball bonded portion was performed by both the direct observation in which the ball bonded portion was subjected to SEW observation to evaluate a degree of the Al sweep-out behavior in an ultrasonic sound applied direction and the indirect observation in which a ball was removed by a shear test to judge the Al sweep-out behavior from the deformation and residual quantity of an Al electrode remaining on the sheared fracture surface. The mark ● denotes the experimental result that little or no Al sweep-out behavior was found and the Al sweep-out behavior was as good as a result brought about by a gold bonding wire. The mark ○ denotes the experimental result that though the Al sweep-out behavior was discernible, whereas their deformation volumes were small. The mark Δ denotes the experimental result that the Al sweep-out behavior increased, but the effect that matters is little. The mark x denotes the experimental result that the Al sweep-out behavior was pronounced to have a need to be improved. These marks were entered in a column "Al film sweep-out behavior" of the table 2.

The loop shape stability in a bonding process was judged with respect to the linearity of a bonding wire and the variations in loop height by preparing a trapezoidal loop by using two types of a general-purpose span of a 2 mm wire length and a short span of a 0.5 mm wire length to observe 500 bonding wires of each of the two types. It was required to more strictly control a loop in order to avoid the contact with a tip end in forming the trapezoidal shape using the wire with a short length of 0.5 mm. The mark x denotes the experimental result that 5 or more wires of 2 mm length were defective in linearity, loop height or the like and therefore it was judged to be of problem. The mark Δ denotes the experimental result that 5 or more wires of 0.5 mm length were defective and therefore it was judged that the wires were required to be improved. The mark ○ denotes the experimental result that 2 to 4 wires of 2 mm length were defective and besides 2 to 4 wires of 2 mm length were defective and therefore the loop shapes were judged to be comparatively good. The mark ● denotes the experimental result that one or no wire of 0.5 mm length was defective and therefore the loop shape was judged to be stable. These marks were entered in a column "loop stability" of the tablet. One of the causes of the defect is assumed to be insufficient bonding performance on the interface between the core material and its periphery and the variation in cross-sectional property.

The evaluations of a flaw and scraping on a wire surface were examined by observing the appearance of a bonded loop. A trapezoidal loop was formed that was produced by using a wire with 25 μm in diameter and 2 mm in length and was provided with 200 μm in target height was formed and then 1,000 wires were observed by a projector. The flaw observation was performed with a focus on upper side of a loop and the scraping observation was performed for 30 μm-or-more-size scraping in the whole of the loop, thus making the evaluations. The mark x denotes the experimental result that 4 or more scraped wires were found and their flaws were pronounced and therefore it was judged to be of a problem. The mark Δ denotes the experimental result that 1 to 3 scraped wires were found, whereas many flaws were found and there was likelihood of clogging a capillary, and therefore it was judged that the wires were required to be improved. The mark ○ denotes the experimental result that 1 to 3 scraped wires were found and no flaw that is seen as a problem was generated and therefore the surfaces of the wires were comparatively good. The mark ● denotes the experimental result that no scraped wire was generated and flaws were unnoticeable and therefore, it was judged that the wires were comparatively stable and good. These marks were entered in a column "loop flaw and scraping" of the table 3. It was apprehensive that the judgment of the flaw and scraping could somewhat be affected by observer's individual judgment and hence two or more observers evaluated the performance ranking through average information.

With respect to the evaluation of surface oxidation of a wire bonded on a semiconductor element, two samples were prepared in which 208 wires were connected on a QFP, and then oxidation status was evaluated from a change in color on the surface of the wire by microscopical observation primarily from an upper portion of a loop. The bonding condition was uniformized at 200 degrees C. stage temperature and about 2 minutes exposing time on a heating stage. The mark x denotes the experimental result that 20 or more wires on whose surfaces were discernibly oxidized were found. The mark Δ denotes the experimental result that 6 to 19 oxidation discernible wires were found and therefore it was judged to require the improvement for exacting requirements. The mark ○ denotes the experimental result that 2 to 5 oxidation discernible wires were found and therefore, it was judged that the oxidation level gave rise to no practical issue. The mark ● denotes the experimental result that one or no oxidation discernible wire was found and therefore the wires were judged to be good. These marks were entered in a column "oxidization on a surface of a wire heated after being bonded" of the table 2.

The evaluation of the unreeling performance was performed by bonding 5,000 wires with 20 μm in diameter, 1 to 3 mm in span, and 150 to 300 μm in loop height to count wires whose linearity deteriorated due to the defects generated from a curl and a crinkle. The mark x denotes the experimental result that 20 or more defective wires with deteriorated linearity were found. The mark Δ denotes the experimental result that 10 to 19 defective wires with deteriorated linearity were found and it was judged that the wires were required to be improved for exacting requirements. The mark ○ denotes the experimental result that 3 to 9 defective wires with linearity that is deteriorated were found and a degree of the deterioration was comparatively small and therefore it was judged that the oxidization level has no practical issue. The mark ● denotes the experimental result that two or less oxidation discernible wires were found and the result was judged to be good. These marks were entered in a column "unreeling performance" of the table 3.

The evaluation of the storage life of a wire was performed by the number of times of non-stick failures in wedge bonding after a bonding wire left in the atmosphere at normal temperature was bonded. The bonding wire was stored inside a clean room with the bonding wire housed in a spool case. The comparison was performed between samples left 30 days and 60 days. In a bonding condition, a normal bonding condition used in mass production and a low-level bonding condition where an output amount of ultrasonic sounds was allowed to slightly decrease to induce the non-stick failure were compared. The lower the temperature, therefore a bonding operation became difficult and hence the stage temperature was made as low as 180 degrees C. to evaluate a non-stick failure generating frequency using 1,000 bonding wires. The mark x denotes the experimental result that 3 or more wires subjected to non-stick failure under normal bonding conditions were found and hence the wires were needed to be improved. The mark Δ denotes the experimental result that 2 or less wires subjected to non-stick failure under the normal bonding conditions were found and besides 5 or less wires subjected to non-stick failure under the low-level bonding conditions were found. The mark ○ denotes the experimental result that no wire that is subjected to non-stick failure under the normal bonding conditions were found and besides 2 to 4 wires subjected to non-stick failure under the low-level bonding conditions were found and therefore, the wires were judged to be substantially good. The mark ● denotes the experimental result that no wire subjected to non-stick failure under the normal bonding conditions was found and besides one or no wire subjected to non-stick failure under the low-level bonding conditions was found and therefore the storage life was judged to be good. These marks were entered in a column "wedge bondability" of the table 2.

In the TCT test, a commercially available TCT test device was employed. As temperature history, employed were two types of conditions, the standard condition, being severe (ranging from −55 degrees C., 30 minutes to 125 degrees C., 30 minutes and an extremely severe condition (ranging from −55 degrees C., 30 minutes to 155 degrees C., 30 minutes). After the test, an electric test was performed to evaluate electric conduction. 40 wires were measured. The mark ● denotes the test result that the percent defective was zero and so high reliability was exhibited. The mark ○ denotes the test result that the percent defective was 1% or less and therefore it was judged that there was no large practical issue. The mark Δ denotes the test result that the percent defective was 2 to 5%. The mark x denotes the test result that the percent defective exceeded 5% and hence, the wires were needed to be improved. These marks were entered in a column "TCT test" of the table 2.

The peel test of wedge bonding was conducted by performing the measurement by drawing up a bonding wire with the insertion angle of a wedged portion being held. This test result was utilized as accelerated evaluation of the TCT test. It was verified that bonding wire with a longer fracture elongation in this test included good performance for resisting stresses to a bonded portion. The mark ● denotes the test result that the fracture elongation in the peel test of wedge bonding was 3% or more and therefore the wire was very good. The mark ○ denotes the test result that the fracture elongation was 1.5% or more and less than 3% and therefore was judged to be sufficient. The mark Δ denotes the test result that the fracture elongation was 1% or more and less than 1.5%. The mark x denotes the test result that the fracture elongation was less than 1% and therefore was judged to be insufficient. These marks were entered in a column "wedge bonding peel test" of the table 2.

For evaluation of the reflow resistance, a semiconductor sample produced by encapsulating a bonding wire and a semiconductor with resin was held inside a reflow furnace at 260 degrees C. for 10 sec and thereafter thermal history of cooling the sample to ambient temperatures was repeated 10 times. Two types of samples were evaluated one of which had a wire bonding condition where the wire was bonded at 200 degrees C., being normal temperature and another of which had a wire bonding condition where the wire was bonded at the temperature as low as 160 degrees C., being a severe condition. After the reflow test, electric measurement was performed to evaluate electric conduction. Four hundred wires were measured. The mark ⊚ denotes the test result that the percent defective was zero and therefore high reliability was exhibited The mark ○ denotes the test result that the percent defective was 1% or less and therefore it was judged that there was no large practical issue. The mark Δ denotes the test result that the percent defective was 2 to 5%. The mark x denotes the test result that the percent defective exceeded 5% and therefore the wires were needed to be improved. These marks were entered in a column "reflow resistance" of the table 2.

In the evaluation of a capillary operating life, after having bonded 50,000 bonding wires, contamination and abrasion of the capillary tip were judged. The mark ○ denotes the evaluation result that the surface of the capillary was clean. The mark Δ denotes the evaluation result that little extraneous substances were attached to the capillary tip and hence there was no operational problem. The mark x denotes the evaluation result that amount and size of extraneous substances were significant. These marks were entered in a column "capillary operating life" of the table 2.

The tables 1 to 3 denote the evaluation results and the comparative examples of the copper bonding wire according to the present invention. In the examples 1 to 33 and the comparative examples C1 to C9, which are expressed in the tables 1, 2, a process that is not applied for concentrating carbon and oxygen on the surface of the outer layer of a wire and the concentrations of the metal M and copper which are expressed in the table 1 were denoted with the total of the metallic elements prescribed as 100 mol %. In the examples B1 to B33 in the table 3, carbon and oxygen were concentrated using the same wires as those indicated by the sample numbers (SA1 to SA33).

In the table 3, the concentrations of carbon and oxygen are calculated with the total of metallic and nonmetallic elements determined as 100 mol %, the metallic elements including copper and the metal M and the nonmetallic elements including carbon, oxygen and nitrogen. It has been checked that in the sample of the same sample number in the tables 1 and 3, the concentration ratio of metallic elements including the metal M, a copper element or the like had fundamentally the same analytical value. Further, it has been checked that with respect to the performance, shown in the table 1, that was subjected by a concentration ratio of a metallic element, an approximately the same evaluation result could be obtained even in the sample whose sample number was the same as that in the table 3. In the examples B1 to B33, the evaluation results of the TCT test for indicating a representative property, the peel test, the reflow resistance and the wedge bonding performance after being left in the atmosphere are shown in the table 3. It has been checked that with respect to the performances such as the ball forming performance, the ball bond shape, Al film sweep-out behavior, and capillary clogging, even in the examples B1 to B33, the same results as those in the table 1 were obtained.

The bonding wire according to the first aspect corresponds to the examples 1 to 33 and B1 to B32. The bonding wire according to the second aspect corresponds to the examples 1 to 32, B1 to B32. The bonding wire according to the third aspect corresponds to the examples 2, 4, 7, 8, 10, 14, 18, 24, 27, 29, 32, B2, B4, 37, 38, B8, B10, B14, B18, B24, B27, B29, B32. The bonding wire according to the fourth aspect corresponds to the examples 3, 18 to 20, 24, 31, B3, B18 to B20, B24, B31. The bonding wire according to the fifth aspect corresponds to the examples 1 to 33 and B1 to B33. The bonding wire according to the sixth aspect corresponds to the examples B1 to B3, B5, B8 to B15, B17, B19 to B20, B22 to B26, B29 to B33. The bonding wire according to the seventh aspect corresponds to the examples B1, B4 to B6, B8 to B18, B20, B22, B24 to B33. The bonding wire according to the eighth aspect corresponds to the examples 2, 3, 5 to 18, 20 to 30, 32, 33, B2, B3, B5 to B18, B20 to B30, B32, B33. The bonding wire according to the ninth aspect corresponds to the examples 1 to 3, 5, 7 to 16, 19 to 24, 26 to 33, B1 to B3, B5, B7 to B16, B19 to B24, B26 to B33. The bonding wire according to the tenth aspect corresponds to the examples 2, 3, 5, 7 to 10, 12 to 16, 18 to 24, 26 to 33, B2, B3, B5, B7 to B10, B12 to B16, B18 to B24, B26 to B33. The bonding wire according to the eleventh aspect corresponds to the examples 1, 2, 5 to 9, 12, 14 to 17, 19, 21 to 23, 25 to 33, B1, B2, B5 to B9, B14 to B17, B19, B21 to B23, B25 to B33. The bonding wire according to the twelfth aspect corresponds to the examples 1, 2, 4 to 12, 15, 19, 21 to 23, 26 to 33, B1, B2, B4 to B12, B15, B19, B21 to B23, B26 to B33. The bonding wire according to the thirteenth aspect corresponds to the examples 2, 3, 5 to 20, 22 to 26, 28 to 33, B2, B3, B5 to B20, B22 to B26, B28 to B33, In the comparative examples 1 to 9, BC1 to BC 9, the results in the case of not satisfying the first aspect are shown.

Part of the evaluation results is described for a representative example of each aspect.

It has been verified that in the multilayer copper bonding wire according to the examples 1 to 33, the outer layer according to the present invention was 0.021 to 0.12 μm in thickness and thus, the bonding wire exhibited high reliability in the TCT test. At the same time, in the comparative example 1 of the conventional monolayer copper wire without an outer layer or the comparative examples 2, 4, 6, 8 where the outer layer was below 0.021 μm in thickness, defects were verified even in the TCT test under the standard conditions. As a desirable instance, it has been verified that in the examples 2, 3, 6 to 18, 21 to 23, 26, 28 to 30, 33 where the outer layer was 0.025 to 0.095 μm in thickness, in the TCT test under extremely severe conditions, the defective percent could be restrained below 1%. Further, it has been verified that in the examples 2, 3, 6 to 16, 22, 23, 26, 28 to 30 where the outer layer was 0.03 to 0.085 μm in thickness, in the TCT test under extremely severe conditions, the percent defective could be restrained below 1%, Furthermore, it has been verified that in the examples 2, 3, 6 to 16, 22, 23, 26, 28 to 30, no defect occurred and high reliability was obtained.

In the multilayer copper bonding wire in the examples 1 to 32, it has been verified that the outer layer according to the present invention was 0.021 to 0.12 μm in thickness and the metals M constituting the outer layer include the main components of at least one element selected from among Au, Pd, Pt and Rh and thus it was comparatively easy to improve reliability, ball forming performance and bond shape in the TCT test in a comprehensive manner, as compared to the practical example 33 where the main component of the outer layer included Ag.

In the comparative examples 3, 5, 7, 9, the outer layer exceeded 0.021 μm in thickness and the wedge bondability was good and further a normal-diameter ball shape was good. Small-diameter balls gave rise to defects, and therefore there is a concern that its application is limited.

In the multilayer copper bonding wires in the examples 2, 4, 7, 8, 10, 14, 18, 24, 27, 29, 32, the core material according to the present invention contained 0.0001 to 0.03 mol % in concentration of at least one element selected from among P, B, Ir, Zr, Bi, Ti, Au, Sn or rare-earth elements and thus it was verified that the fracture elongation was large in the peel test of wedge bonding. This suggests that reliability in the wedge bonding can be improved in a comprehensive manner.

In the multilayer copper bonding wires in the examples 3, 18 to 20, 24, 31, it has been verified that the outer layer according to the present invention contained at least one element selected from among Bi, P, Se, Tl and its surface concentration was 0.01 to 5 mol % and thus the capillary clogging could be restrained. As a result, the capillary operating life can be lengthened thus, improving productivity.

In the multilayer copper bonding wires in the examples B1 to B3, B5, B8 to B15, B17, B19 to B20, B22 to B26, B29 to B33, it has been verified that the outer layer according to the present invention was 0.021 to 0.12 μm in thickness and the carbon concentration on the outermost surface of the outer layer was 15 to 80 mol % and further a region where the carbon concentration in the depth direction from the surface was 5 to 80 mol % was 0.0004 to 0.01 μm. in thickness As a result, it has been verified that the surface of the wire was enhanced in sliding performance and thus a flaw and scraping of a wire could be restrained. Desirably, it has been verified that in the examples B1 to B3, B8, B10 to B15, B17, B20, B22 to B26, B29 to B33, a profound effect of suppressing a flaw and scraping was exerted.

In the multilayer copper bonding wires in the examples B1, B4 to B6, B8 to B18, B20, B22, B24 to B33, it has been verified that the outer layer according to the present invention was 0.021 to 0.12 μm in thickness and the oxygen concentration on the outermost surface of the outer layer was 1 to 25 mol % and further a region where the oxygen in the depth direction from the surface of the outer layer with a concentration of 0.2 to 25 mol % was 0.0005 to 0.007 μm in thickness. As a result, it has been verified that the wire unreeling performance was improved and thus curl and bending could be reduced, producing a good result.

In the multilayer copper bonding wires in the examples 2, 3, 5 to 18, to 30, 32, 33, it has been verified that the outer layer was 0.021 to 0.12 μm in thickness and a region where the metal M with the concentration of 10 mol % or more was 0.03 to 0.2 μm in thickness and then as a result the reliability of the wire in the reflow test was high. Desirably, in the examples 2, 3, 6 to 18, 20, 22 to 25, 26 to 30, 32, 33, it has been verified that even in the samples bonded at low temperature, reflow resistance was high.

In the multilayer copper bonding wires in the examples 1 to 3, 5, 7 to 16, 19 to 24, and 26 to 33, the outer layer according to the present invention is 0.021 to 0.12 μm in thickness and besides a region where the total of the metal M concentration is 90 mol % or more is 0.004 to 0.07 μm in thickness. As a result, it has been verified that the wedge bondability after the wire had been left in the atmosphere for 30 days was good and even as compared to the comparative example 1 where the wire was provided with no outer layer or the comparative examples 2, 4, 6, 8 where the outer layer was below 0.021 μm in thickness, the storage life of the bonding wire was improved. Desirably, it has been verified that in the examples 2, 3, 7 to 16, 19, 22 to 24, 27 to 33 where the region was 0.008 to 0.06 μm in thickness, the wedge bondability of the wire after the wire had been left for 60 days was good.

In the multilayer copper bonding wires in the examples 2, 3, 5, 7 to 10, 12 to 16, 18 to 24, and 26 to 33, it has been verified that the outer layer according to the present invention was 0.021 to 0.12 μm in thickness and a region where the metal M with the concentration of 96 mol % or more in total was 0.002 to 0.06 μm in thickness. As a result, it has been verified that even if the wire bonded in a bonding process was heated on a stage, high-temperature oxidization of the wire could be restrained.

In the multilayer copper bonding wires in the examples 1, 2, 5 to 9, 12, 14 to 17, 19, 21 to 23, 25 to 33, the outer layer according to the present invention is 0.021 to 0.12 μm in thickness and a copper concentration on the outermost surface is 0.5 to 45 mol %. As a result, the eccentricity in bonding a ball is reduced to permit a good ball bonded shape to be obtained. Desirably, if the examples 1, 2, 5, 7, 8, 12, 14 to 16, 19, 21, 22, 25, 27, 29, 31, 33 where the copper concentration was 0.5 to 20 mol % were performed, even if using a small-diameter ball, the bonded shape was improved.

In the multilayer copper bonding wires in the examples 1, 2, 4 to 12, 15, 19, 21 to 23, 26 to 33, the outer layer according to the present invention is 0.021 to 0.12 μm in thickness and a region where the copper relative to the total of metallic elements has a concentration of 1 to 39 mol % is 0.0005 to 0.008 μm in thickness. As a result, shrinkage cavities on a ball tip and minute unevenness on a surface of a ball can be reduced.

In the multilayer copper bonding wires in the examples 2, 3, 5 to 20, 22 to 26, 28 to 33, the outer layer according to the present invention is 0.021 to 0.12 μm in thickness and the concentration of the metals M other than copper is 0.05 to 3 mol % in total. As a result, an effect of reducing the Al sweep-out behavior in bonding a ball can be obtained.

In the multilayer copper bonding wires in the comparative examples 1 to 33, it has been verified that the outer layer according to the present invention was 0.021 to 0.12 μm in thickness As a result, it has been verified that in addition to the fact that a good ball shape was obtained by using the standard gas 5 vol % $H_2+N_2$ as a shield gas in forming a ball, even in using a pure $N_2$ gas, a ball shape was given approximate sphericity, leading to good result.

TABLE 1

| | | | | Outer layer | | | | |
| --- | --- | --- | --- | --- | --- | --- | --- | --- |
| | Test No. | Wire base material No. | Metal M | Outer layer thickness (metal M concentration is 50 mol % or more)/μm | Metal M concentration is 10 mol % or more/μm | Metal M concentration is 90 mol % or more/μm | metal M concentration is 96 mol % or more/μm | Cu concentration/ mol % on outer- most surface | Thickness/μm of Cu of 1 to 30 mol % concentration |
| Examples | 1 | SA1 | Au | 0.021 | 0.027 | 0.005 | 0.001 | 8 | 0.0005 |
| | 2 | SA2 | Au | 0.04 | 0.07 | 0.01 | 0.005 | 13 | 0.001 |
| | 3 | SA3 | Au | 0.07 | 0.11 | 0.03 | 0.01 | 0 | 0 |
| | 4 | SA4 | Au | 0.11 | 0.23 | 0.002 | 0 | 50 | 0.002 |
| | 5 | SA5 | Pd | 0.023 | 0.035 | 0.006 | 0.003 | 2 | 0.0008 |
| | 6 | SA6 | Pd | 0.03 | 0.08 | 0.002 | 0 | 40 | 0.002 |
| | 7 | SA7 | Pd | 0.035 | 0.05 | 0.01 | 0.007 | 15 | 0.0006 |

TABLE 1-continued

| | Test No. | Sample | Metal M | | | | | | | Metal M concentration/mol % inside wire | Added element and concentration/mol % in core material | Added element and concentration/mol % in outer layer | Manufacturing method (A: nonelectrolytic, B: electrolytic, C: vapor deposition, D: melting) | Wire diameter/μm |
|---|---|---|---|---|---|---|---|---|---|---|---|---|---|---|
| Examples | 1 | | | | | | | | | 0.04 | | | C | 25 |
| | 2 | | | | | | | | | 0.4 | B 0.0005 | | A | 25 |
| | 3 | | | | | | | | | 0.6 | | Tl 0.1 | B | 20 |
| | 4 | | | | | | | | | 3.3 | Ir 0.002 | | D | 15 |
| | 5 | | | | | | | | | 0.1 | | | C | 25 |
| | 6 | | | | | | | | | 0.2 | | | A | 25 |
| | 7 | | | | | | | | | 0.3 | Zr 0.005 | | B | 18 |
| | 8 | SA8 | Pd | 0.04 | 0.06 | 0.02 | 0.012 | 18 | 0.001 | 0.4 | Ag 0.01 | | A | 25 |
| | 9 | SA9 | Pd | 0.045 | 0.08 | 0.01 | 0.008 | 32 | 0.002 | 0.5 | | | B | 25 |
| | 10 | SA10 | Pd | 0.05 | 0.08 | 0.03 | 0.03 | 0.1 | 0.0008 | 0.5 | P 0.0005, Bi 0.001 | | B | 20 |
| | 11 | SA11 | Pd | 0.055 | 0.13 | 0.005 | 0 | 48 | 0.005 | 0.7 | | | B | 25 |
| | 12 | SA12 | Pd | 0.06 | 0.11 | 0.02 | 0.01 | 10 | 0.001 | 0.7 | | | B | 30 |
| | 13 | SA13 | Pd | 0.065 | 0.09 | 0.055 | 0.04 | 0 | 0 | 0.8 | | | B | 25 |
| | 14 | SA14 | Pd | 0.07 | 0.12 | 0.04 | 0.02 | 1 | 0.0002 | 0.9 | B 0.001 | | B | 30 |
| | 15 | SA15 | Pd | 0.075 | 0.13 | 0.02 | 0.008 | 13 | 0.001 | 1 | | | B | 25 |
| | 16 | SA16 | Pd | 0.085 | 0.12 | 0.05 | 0.03 | 0.5 | 0 | 1.1 | | | B | 25 |
| | 17 | SA17 | Pd | 0.09 | 0.15 | 0 | 0 | 40 | 0.01 | 1.2 | | | B | 23 |
| | 18 | SA18 | Pd | 0.095 | 0.15 | 0.08 | 0.06 | 0 | 0 | 1.5 | Ti 0.005, Au 0.01 | P 0.1 | B | 25 |
| | 19 | SA19 | Pd | 0.11 | 0.25 | 0.03 | 0.004 | 10 | 0.001 | 2.1 | | Se 0.02 | B | 20 |
| | 20 | SA20 | Pd | 0.12 | 0.2 | 0.065 | 0.04 | 0 | 0 | 2.3 | | Bi 0.01 | D | 35 |
| | 21 | SA21 | Pt | 0.027 | 0.035 | 0.007 | 0.002 | 10 | 0.0006 | 0.04 | | | C | 15 |
| | 22 | SA22 | Pt | 0.04 | 0.09 | 0.01 | 0.006 | 13 | 0.001 | 0.3 | | | A | 20 |
| | 23 | SA23 | Pt | 0.08 | 0.12 | 0.02 | 0.008 | 22 | 0.001 | 0.7 | | | A | 23 |
| | 24 | SA24 | Pt | 0.1 | 0.16 | 0.04 | 0.02 | 0 | 0 | 1.1 | Ir 0.025 | P 0.15 | B | 25 |
| | 25 | SA25 | Pt | 0.12 | 0.19 | 0.08 | 0.07 | 0.8 | 0.0003 | 1.6 | | | D | 23 |
| | 26 | SA26 | Rh | 0.03 | 0.07 | 0.007 | 0.003 | 24 | 0.002 | 0.2 | | | B | 18 |
| | 27 | SA27 | Rh | 0.11 | 0.18 | 0.04 | 0.02 | 11 | 0.001 | 3.2 | Ti 0.001, Zr 0.002 | | D | 20 |
| | 28 | SA28 | Au, Pd | 0.05 | 0.08 | 0.03 | 0.01 | 24 | 0.003 | 0.3 | | | C | 23 |
| | 29 | SA29 | Au, Pd | 0.08 | 0.12 | 0.03 | 0.01 | 5 | 0.001 | 0.8 | Sn 0.01 | | B | 25 |
| | 30 | SA30 | Pd, Pt | 0.07 | 0.14 | 0.02 | 0.006 | 28 | 0.003 | 0.8 | | | D | 30 |
| | 31 | SA31 | Au, Pt | 0.022 | 0.29 | 0.01 | 0.005 | 9 | 0.001 | 0.1 | | P 0.2 | A | 18 |
| | 32 | SA32 | Pd, Rh | 0.1 | 0.17 | 0.02 | 0.01 | 4 | 0.0008 | 1.5 | Ag 0.03 | | D | 30 |
| | 33 | SA33 | Ag | 0.09 | 0.15 | 0.043 | 0.02 | 38 | 0.007 | 1.2 | | | B | 25 |
| Comparative examples | 1 | RF1 | — | — | — | — | — | — | — | — | | | — | 25 |
| | 2 | RF2 | Au | 0.018 | 0.02 | 0 | 0 | 35 | 0.001 | 0.04 | | | A | 25 |
| | 3 | RF3 | Au | 0.13 | 0.18 | 0.06 | 0.03 | 15 | 0.0002 | 2.4 | | | B | 20 |
| | 4 | RF4 | Pd | 0.015 | 0.023 | 0.004 | 0.001 | 60 | 0.004 | 0.07 | | | A | 25 |
| | 5 | RF5 | Pd | 0.17 | 0.23 | 0.08 | 0.07 | 22 | 0.002 | 2.3 | | | B | 25 |
| | 6 | RF6 | Pt | 0.019 | 0.032 | 0.07 | 0.03 | 57 | 0.003 | | | | | |
| | 7 | RF7 | Pt | 0.14 | 0.18 | 0.8 | 0.5 | 51 | 0.001 | | | | | |
| | 8 | RF8 | Rh | 0.015 | 0.027 | 0 | 0 | 67 | 0.002 | | | | | |
| | 9 | RF9 | Rh | 0.17 | 0.25 | 0.1 | 0.07 | 73 | 0.004 | | | | | |

TABLE 1-continued

| | | | | | |
|---|---|---|---|---|---|
| | 6 | 0.12 | | C | 25 |
| | 7 | 3.2 | | D | 25 |
| | 8 | 0.1 | | B | 18 |
| | 9 | 3.4 | | B | 25 |

TABLE 2

| | Test No. | TCT test −55/120° C. 1000 cycle | TCT test −55/150° C. 2000 cycle | Wedge bonding peel test | Reflow resistance Bonding at normal temperature | Reflow resistance Bonding at low temperature | Wedge bondability After left for 30 days | Wedge bondability After left for 60 days | Ball forming performance $N_2 + 5\% H_2$ | Ball forming performance $N_2$ |
|---|---|---|---|---|---|---|---|---|---|---|
| Examples | 1 | ◎ | △ | ○ | ○ | △ | ◎ | △ | ◎ | ◎ |
| | 2 | ◎ | ◎ | ◎ | ◎ | ◎ | ◎ | ◎ | ◎ | ◎ |
| | 3 | ◎ | ◎ | ○ | ◎ | ◎ | ◎ | ◎ | ◎ | ◎ |
| | 4 | ◎ | △ | ◎ | ◎ | ○ | △ | △ | ◎ | ◎ |
| | 5 | ◎ | △ | ○ | ◎ | ○ | ◎ | ○ | ◎ | ○ |
| | 6 | ◎ | ◎ | ○ | ◎ | ◎ | ○ | △ | ◎ | ○ |
| | 7 | ◎ | ◎ | ◎ | ◎ | ◎ | ◎ | ◎ | ◎ | ◎ |
| | 8 | ◎ | ◎ | ◎ | ◎ | ◎ | ◎ | ◎ | ◎ | ◎ |
| | 9 | ◎ | ◎ | ○ | ◎ | ◎ | ◎ | ◎ | ◎ | ◎ |
| | 10 | ◎ | ◎ | ◎ | ◎ | ◎ | ◎ | ◎ | ◎ | ◎ |
| | 11 | ◎ | ◎ | ○ | ◎ | ◎ | ◎ | ◎ | ◎ | ◎ |
| | 12 | ◎ | ◎ | ○ | ◎ | ◎ | ◎ | ◎ | ◎ | ◎ |
| | 13 | ◎ | ◎ | ○ | ◎ | ◎ | ◎ | ◎ | ◎ | ◎ |
| | 14 | ◎ | ◎ | ◎ | ◎ | ◎ | ◎ | ◎ | ◎ | ◎ |
| | 15 | ◎ | ◎ | ○ | ◎ | ◎ | ◎ | ◎ | ◎ | ◎ |
| | 16 | ◎ | ◎ | ○ | ◎ | ◎ | ◎ | ◎ | ◎ | ◎ |
| | 17 | ◎ | ○ | ○ | ◎ | ◎ | ○ | △ | ◎ | ◎ |
| | 18 | ◎ | ○ | ◎ | ◎ | ◎ | ○ | ○ | ◎ | ◎ |
| | 19 | ◎ | △ | ○ | ○ | △ | ◎ | ◎ | ◎ | ◎ |
| | 20 | ◎ | △ | ○ | ◎ | ◎ | ◎ | ○ | ◎ | ◎ |
| | 21 | ◎ | ○ | ○ | ◎ | ○ | ◎ | △ | ◎ | ○ |
| | 22 | ◎ | ◎ | ○ | ◎ | ◎ | ◎ | ◎ | ◎ | ◎ |
| | 23 | ◎ | ◎ | ○ | ◎ | ◎ | ◎ | ◎ | ◎ | ◎ |
| | 24 | ◎ | △ | ◎ | ◎ | ◎ | ◎ | ◎ | ◎ | ◎ |
| | 25 | ◎ | △ | ○ | ◎ | ◎ | ○ | △ | ◎ | ◎ |
| | 26 | ◎ | ◎ | ○ | ◎ | ◎ | ◎ | △ | ◎ | ○ |
| | 27 | ◎ | ○ | ◎ | ◎ | ◎ | ◎ | ◎ | ◎ | ◎ |
| | 28 | ◎ | ◎ | ○ | ◎ | ◎ | ◎ | ◎ | ◎ | ◎ |
| | 29 | ◎ | ◎ | ◎ | ◎ | ◎ | ◎ | ◎ | ◎ | ◎ |
| | 30 | ◎ | ◎ | ○ | ◎ | ◎ | ◎ | ◎ | ◎ | ◎ |
| | 31 | ◎ | △ | ○ | ○ | △ | ◎ | ◎ | ◎ | ◎ |
| | 32 | ◎ | △ | ◎ | ◎ | ◎ | ◎ | ◎ | ◎ | ◎ |
| | 33 | ◎ | ○ | ○ | ◎ | ◎ | ◎ | ◎ | ○ | ○ |
| Comparative examples | 1 | X | X | X | X | X | X | X | ◎ | X |
| | 2 | △ | X | X | △ | X | △ | X | △ | X |
| | 3 | ○ | X | ○ | ○ | △ | ○ | △ | △ | X |
| | 4 | X | X | X | △ | X | △ | X | △ | X |
| | 5 | ○ | X | ○ | ○ | △ | ○ | △ | △ | X |
| | 6 | X | X | X | △ | X | △ | X | △ | X |
| | 7 | ○ | X | ○ | ○ | △ | ○ | △ | △ | X |
| | 8 | X | X | △ | △ | X | △ | X | △ | X |
| | 9 | ○ | X | ○ | ○ | △ | ○ | △ | △ | X |

| | Test No. | Ball bonded shape Normal diameter ball | Ball bonded shape Small diameter ball | Shrinkage cavity, surficial unevenness | Al film sweep-out behavior | Surficial oxidization of wire heated after being bonded | Loop stability | Capillary operating life |
|---|---|---|---|---|---|---|---|---|
| Examples | 1 | ◎ | ◎ | ◎ | ○ | ○ | ◎ | ○ |
| | 2 | ◎ | ◎ | ◎ | ◎ | ◎ | ◎ | ○ |
| | 3 | ○ | ○ | ○ | ◎ | ◎ | ◎ | ◎ |
| | 4 | △ | △ | ◎ | △ | ○ | △ | ○ |
| | 5 | ◎ | ◎ | ◎ | ◎ | ◎ | ◎ | ○ |
| | 6 | ◎ | ○ | ◎ | ◎ | △ | ◎ | ○ |
| | 7 | ◎ | ◎ | ◎ | ◎ | ◎ | ◎ | ○ |
| | 8 | ◎ | ◎ | ◎ | ◎ | ◎ | ◎ | ○ |
| | 9 | ◎ | ○ | ◎ | ◎ | ◎ | ◎ | ○ |
| | 10 | ○ | ○ | ◎ | ◎ | ◎ | ◎ | ○ |
| | 11 | ○ | △ | ◎ | ◎ | △ | ◎ | ○ |
| | 12 | ◎ | ◎ | ◎ | ◎ | ◎ | ◎ | ○ |
| | 13 | ○ | ○ | ◎ | ◎ | ◎ | ◎ | ○ |
| | 14 | ◎ | ◎ | ○ | ◎ | ◎ | ◎ | ○ |

TABLE 2-continued

| | | | | | | | | | |
|---|---|---|---|---|---|---|---|---|---|
| | | 15 | ⊚ | ⊚ | ○ | ⊚ | ⊚ | ⊚ | ○ |
| | | 16 | ⊚ | ⊚ | ○ | ⊚ | ⊚ | ⊚ | ○ |
| | | 17 | ⊚ | ○ | ⊚ | ⊚ | △ | ⊚ | ○ |
| | | 18 | ○ | ○ | ⊚ | ⊚ | ⊚ | ⊚ | ⊚ |
| | | 19 | ⊚ | ⊚ | ⊚ | ⊚ | ⊚ | △ | ⊚ |
| | | 20 | ○ | ○ | ○ | ⊚ | ⊚ | ⊚ | ⊚ |
| | | 21 | ⊚ | ⊚ | ⊚ | ○ | ⊚ | ⊚ | ○ |
| | | 22 | ⊚ | ⊚ | ⊚ | ⊚ | ⊚ | ⊚ | ○ |
| | | 23 | ⊚ | ○ | ⊚ | ⊚ | ⊚ | ⊚ | ⊚ |
| | | 24 | ○ | ○ | ○ | ⊚ | ⊚ | ⊚ | ⊚ |
| | | 25 | ⊚ | ⊚ | ○ | ⊚ | ○ | ⊚ | ○ |
| | | 26 | ⊚ | ○ | ⊚ | ⊚ | ⊚ | ⊚ | ○ |
| | | 27 | ⊚ | ⊚ | ⊚ | △ | ⊚ | ⊚ | ○ |
| | | 28 | ⊚ | ○ | ⊚ | ⊚ | ⊚ | ⊚ | ○ |
| | | 29 | ⊚ | ⊚ | ⊚ | ⊚ | ⊚ | ⊚ | ○ |
| | | 30 | ⊚ | ○ | ⊚ | ⊚ | ⊚ | ⊚ | ○ |
| | | 31 | ⊚ | ⊚ | ⊚ | ⊚ | ⊚ | △ | ⊚ |
| | | 32 | ⊚ | ⊚ | ⊚ | ⊚ | ⊚ | ⊚ | ○ |
| | | 33 | ⊚ | ○ | ⊚ | ⊚ | ⊚ | ○ | ○ |
| Comparative examples | | 1 | ⊚ | ○ | X | ⊚ | X | ⊚ | ⊚ |
| | | 2 | △ | △ | △ | ⊚ | △ | ⊚ | ○ |
| | | 3 | ○ | △ | X | X | ⊚ | ⊚ | ○ |
| | | 4 | X | X | △ | ⊚ | ⊚ | ⊚ | ○ |
| | | 5 | ○ | △ | △ | X | ⊚ | X | ○ |
| | | 6 | X | X | △ | ⊚ | ⊚ | X | ○ |
| | | 7 | ○ | △ | △ | X | ⊚ | ○ | ○ |
| | | 8 | X | X | △ | ⊚ | △ | ⊚ | ○ |
| | | 9 | ○ | △ | △ | X | ⊚ | X | ○ |

TABLE 3

| | Test No. | Wire base material No. | Outer layer Metal M | Outer layer thickness (metal M concentration is 50 mol % or more)/μm | Outermost surface C concentration/mol % | Thickness/μm of C of 5 to 80 mol % concentration | Outermost surface O concentration/mol % | Thickness/μm of O of 0.2 to 25 mol % concentration | Wire diameter/μm |
|---|---|---|---|---|---|---|---|---|---|
| Examples | B1 | SA1 | Au | 0.021 | 45 | 0.001 | 2 | 0.001 | 25 |
| | B2 | SA2 | Au | 0.04 | 32 | 0.001 | 1.2 | 0.0004 | 25 |
| | B3 | SA3 | Au | 0.07 | 75 | 0.003 | 0.5 | <0.0002 | 20 |
| | B4 | SA4 | Au | 0.11 | 83 | 0.008 | 5 | 0.001 | 15 |
| | B5 | SA5 | Pd | 0.023 | 54 | 0.0005 | 1.5 | 0.0008 | 25 |
| | B6 | SA6 | Pd | 0.03 | 13 | 0.0008 | 23 | 0.001 | 25 |
| | B7 | SA7 | Pd | 0.035 | 33 | 0.0003 | 0.8 | <0.0002 | 18 |
| | B8 | SA8 | Pd | 0.04 | 42 | 0.002 | 7 | 0.002 | 25 |
| | B9 | SA9 | Pd | 0.045 | 23 | 0.0004 | 20 | 0.004 | 25 |
| | B10 | SA10 | Pd | 0.05 | 38 | 0.001 | 2 | 0.001 | 20 |
| | B11 | SA11 | Pd | 0.055 | 53 | 0.003 | 24 | 0.007 | 25 |
| | B12 | SA12 | Pd | 0.06 | 66 | 0.002 | 8 | 0.001 | 30 |
| | B13 | SA13 | Pd | 0.065 | 47 | 0.001 | 2 | 0.001 | 25 |
| | B14 | SA14 | Pd | 0.07 | 52 | 0.001 | 3 | 0.001 | 30 |
| | B15 | SA15 | Pd | 0.075 | 33 | 0.003 | 8 | 0.002 | 25 |
| | B16 | SA16 | Pd | 0.085 | 82 | 0.006 | 2 | 0.0008 | 25 |
| | B17 | SA17 | Pd | 0.09 | 44 | 0.009 | 17 | 0.003 | 23 |
| | B18 | SA18 | Pd | 0.095 | 17 | 0.0003 | 1 | 0.0006 | 25 |
| | B19 | SA19 | Pd | 0.11 | 53 | 0.008 | 29 | 0.008 | 20 |
| | B20 | SA20 | Pd | 0.12 | 40 | 0.002 | 8 | 0.003 | 35 |
| | B21 | SA21 | Pt | 0.027 | 12 | 0.0005 | 0.3 | <0.0002 | 15 |
| | B22 | SA22 | Pt | 0.04 | 53 | 0.001 | 7 | 0.001 | 20 |
| | B23 | SA23 | Pt | 0.08 | 69 | 0.004 | 0.5 | 0.0005 | 23 |
| | B24 | SA24 | Pt | 0.1 | 73 | 0.009 | 3 | 0.002 | 25 |
| | B25 | SA25 | Pt | 0.12 | 29 | 0.001 | 5 | 0.002 | 23 |
| | B26 | SA26 | Rh | 0.03 | 45 | 0.002 | 15 | 0.001 | 18 |
| | B27 | SA27 | Rh | 0.11 | 68 | 0.011 | 2 | 0.001 | 20 |
| | B28 | SA28 | Au, Pd | 0.05 | 75 | 0.015 | 7 | 0.002 | 23 |
| | B29 | SA29 | Au, Pd | 0.08 | 45 | 0.002 | 3 | 0.001 | 25 |
| | B30 | SA30 | Pd, Pt | 0.07 | 33 | 0.002 | 12 | 0.003 | 30 |
| | B31 | SA31 | Au, Pt | 0.022 | 50 | 0.003 | 3 | 0.001 | 18 |
| | B32 | SA32 | Pd, Rh | 0.1 | 63 | 0.001 | 2 | 0.001 | 30 |
| | B33 | SA33 | Ag | 0.09 | 42 | 0.003 | 13 | 0.004 | 25 |
| Comparative examples | BC1 | RF1 | — | — | 38 | 0.001 | 23 | 0.007 | 25 |
| | BC2 | RF2 | Au | 0.018 | 32 | 0.002 | 1 | 0.0006 | 25 |
| | BC3 | RF3 | Au | 0.13 | 72 | 0.002 | 0.5 | <0.0002 | 20 |

TABLE 3-continued

| | | | | | | | | |
|---|---|---|---|---|---|---|---|---|
| BC4 | RF4 | Pd | 0.015 | 25 | 0.002 | 22 | 0.002 | 25 |
| BC5 | RF5 | Pd | 0.17 | 45 | 0.003 | 4 | 0.002 | 25 |
| BC6 | RF6 | Pt | 0.019 | 33 | 0.002 | 3 | 0.004 | 25 |
| BC7 | RF7 | Pt | 0.14 | 15 | 0.0003 | 0.8 | <0.0002 | 25 |
| BC8 | RF8 | Rh | 0.015 | 62 | 0.003 | 18 | 0.003 | 18 |
| BC9 | RF9 | Rh | 0.17 | 48 | 0.004 | 28 | 0.007 | 25 |

| | Test No. | TCT test −55/120° C. 1000 cycle | TCT test −55/150° C. 2000 cycle | Wedge bonding peel test | Reflow resistance Bonding at normal temperature | Reflow resistance Bonding at low temperature | Wedge bondability After left for 30 days | Wedge bondability After left for 60 days | Flaw and scraping of loop | Unreeling performance |
|---|---|---|---|---|---|---|---|---|---|---|
| Examples | B1 | ◎ | △ | ○ | ○ | △ | ◎ | △ | ◎ | ◎ |
| | B2 | ◎ | ◎ | ◎ | ◎ | ◎ | ◎ | ○ | ◎ | ○ |
| | B3 | ◎ | ◎ | ○ | ◎ | ◎ | ◎ | ◎ | ◎ | △ |
| | B4 | ◎ | △ | ◎ | ○ | △ | ○ | △ | ○ | ◎ |
| | B5 | ◎ | △ | ○ | ◎ | ○ | ◎ | ○ | ○ | ◎ |
| | B6 | ◎ | ◎ | ○ | ◎ | ◎ | ○ | △ | △ | ◎ |
| | B7 | ◎ | ◎ | ◎ | ◎ | ◎ | ◎ | ○ | △ | ○ |
| | B8 | ◎ | ◎ | ◎ | ◎ | ◎ | ◎ | ◎ | ◎ | ◎ |
| | B9 | ◎ | ◎ | ○ | ◎ | ◎ | ◎ | ◎ | ○ | ◎ |
| | B10 | ◎ | ◎ | ◎ | ◎ | ◎ | ◎ | ◎ | ◎ | ◎ |
| | B11 | ◎ | ◎ | ○ | ◎ | ◎ | ◎ | ◎ | ◎ | ◎ |
| | B12 | ◎ | ◎ | ○ | ◎ | ◎ | ◎ | ◎ | ◎ | ◎ |
| | B13 | ◎ | ◎ | ○ | ◎ | ◎ | ◎ | ○ | ◎ | ◎ |
| | B14 | ◎ | ◎ | ◎ | ◎ | ◎ | ◎ | ◎ | ◎ | ◎ |
| | B15 | ◎ | ◎ | ○ | ◎ | ◎ | ◎ | ◎ | ◎ | ◎ |
| | B16 | ◎ | ◎ | ○ | ◎ | ◎ | ◎ | ◎ | ○ | ◎ |
| | B17 | ◎ | ○ | ○ | ◎ | ◎ | ○ | △ | ◎ | ◎ |
| | B18 | ◎ | ○ | ◎ | ◎ | ◎ | ○ | ○ | △ | ◎ |
| | B19 | ◎ | △ | ○ | ○ | △ | ◎ | ◎ | ○ | ○ |
| | B20 | ◎ | △ | ○ | ◎ | ◎ | ◎ | ◎ | ○ | ◎ |
| | B21 | ◎ | ○ | ○ | ◎ | ○ | ◎ | △ | △ | △ |
| | B22 | ◎ | ◎ | ○ | ◎ | ◎ | ◎ | ○ | ◎ | ◎ |
| | B23 | ◎ | ◎ | ○ | ◎ | ◎ | ◎ | ◎ | ◎ | △ |
| | B24 | ◎ | △ | ◎ | ◎ | ◎ | ◎ | ○ | ◎ | ◎ |
| | B25 | ◎ | △ | ○ | ◎ | ◎ | ○ | △ | ◎ | ◎ |
| | B26 | ◎ | ◎ | ○ | ◎ | ◎ | ◎ | △ | ◎ | ◎ |
| | B27 | ◎ | ○ | ◎ | ◎ | ◎ | ◎ | ◎ | ○ | ◎ |
| | B28 | ◎ | ◎ | ◎ | ◎ | ◎ | ◎ | ◎ | ○ | ◎ |
| | B29 | ◎ | ◎ | ◎ | ◎ | ◎ | ◎ | ◎ | ◎ | ◎ |
| | B30 | ◎ | ◎ | ○ | ◎ | ◎ | ◎ | ◎ | ◎ | ◎ |
| | B31 | ◎ | △ | ○ | ○ | △ | ◎ | ◎ | ◎ | ◎ |
| | B32 | ◎ | △ | ○ | ◎ | ◎ | ◎ | ○ | ◎ | ◎ |
| | B33 | ◎ | ○ | ○ | ◎ | ◎ | ◎ | ○ | ◎ | ◎ |
| Comparative examples | BC1 | X | X | X | X | X | X | X | △ | X |
| | BC2 | △ | X | X | △ | X | △ | X | ○ | ○ |
| | BC3 | ○ | X | ○ | ○ | △ | ○ | △ | ○ | △ |
| | BC4 | X | X | X | △ | X | △ | X | ○ | ○ |
| | BC5 | ○ | X | ○ | ○ | △ | ○ | △ | ○ | ○ |
| | BC6 | X | X | X | △ | X | △ | X | ○ | ○ |
| | BC7 | ○ | X | ○ | ○ | △ | ○ | △ | △ | △ |
| | BC8 | X | X | X | △ | X | △ | X | ○ | ○ |
| | BC9 | ○ | X | ○ | ○ | △ | ○ | △ | ○ | ○ |

The invention claimed is:

1. A semiconductor device bonding wire comprising:
a core material whose components include copper as a main component; and
an outer layer provided on said core material, said outer layer containing a metal M that differs from said core material in one or both of components and composition, and copper,
wherein said outer layer is 0.021 to 0.12 μm in thickness,
said metal M includes at least one element selected from among Au, Pd, Pt and Rh as a main component, and
said core material including copper as a main component contains at least one element selected from among P, B, Ir, Zr, Bi, and Ti, and an elemental concentration of said at least one element relative to the whole of the wire is in a range of from 0.0001 to 0.03 mol % in total.

2. The semiconductor device bonding wire according to claim 1, wherein said outer layer contains at least one element selected from among Bi, P, Se and Tl, and an elemental concentration of said at least one element on the outermost surface of said outer layer is in a range of from 0.01 to 5 mol % in total.

3. The semiconductor device bonding wire according to claim 1, wherein a diffusion layer is provided between said outer layer and said core material.

4. The semiconductor device bonding wire according to claim 1, wherein a region where a concentration of said metal M relative to a total of metallic elements is 10 mol % or more is 0.03 to 0.2 μm in thickness.

5. The semiconductor device bonding wire according to claim 1, wherein a region inside said outer layer where a total concentration of said metal M relative to a total of metallic elements is 90 mol % or more is 0.004 to 0.07 μm in thickness.

6. The semiconductor device bonding wire according to claim 1, wherein a region inside said outer layer where a total concentration of said metal M relative to a total of metallic elements is 96 mol % or more is 0.002 to 0.06 μm in thickness.

7. The semiconductor device bonding wire according to claim 1, wherein a copper concentration relative to a total of metallic elements in the outermost layer of the outer layer is 0.5 to 45 mol %.

8. The semiconductor device bonding wire according to claim 1, wherein a region inside said outer layer where a copper concentration relative to a total of metallic elements is in a range of from 1 to 30 mol % is 0.0005 to 0.008 μm in thickness.

9. The semiconductor device bonding wire according to claim 1, wherein a concentration of said metal M, which is contained in an entire wire and is other than copper, relative to a total of metallic elements is in a range of from 0.05 to 3 mol %.

10. The semiconductor device bonding wire according to claim 1, wherein said outer layer is 0.021 to 0.095 μm in thickness.

* * * * *